(12) United States Patent
Makala et al.

(10) Patent No.: US 10,468,596 B2
(45) Date of Patent: Nov. 5, 2019

(54) DAMASCENE PROCESS FOR FORMING THREE-DIMENSIONAL CROSS RAIL PHASE CHANGE MEMORY DEVICES

(71) Applicant: SANDISK TECHNOLOGIES LLC, Plano, TX (US)

(72) Inventors: Raghuveer S. Makala, Campbell, CA (US); Senaka Kanakamedala, San Jose, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/901,633

(22) Filed: Feb. 21, 2018

(65) Prior Publication Data
US 2019/0259946 A1 Aug. 22, 2019

(51) Int. Cl.
| H01L 21/20 | (2006.01) |
| H01L 45/00 | (2006.01) |
| H01L 27/24 | (2006.01) |

(52) U.S. Cl.
CPC ...... *H01L 45/1683* (2013.01); *H01L 27/2427* (2013.01); *H01L 27/2481* (2013.01); *H01L 45/065* (2013.01); *H01L 45/124* (2013.01)

(58) Field of Classification Search
CPC ............. H01L 45/1683; H01L 27/2427; H01L 27/2481; H01L 45/065; H01L 45/124
USPC ......................................................... 438/382
See application file for complete search history.

(56) References Cited

U.S. PATENT DOCUMENTS

| 3,972,059 A | 7/1976 | DiStefano |
| 5,535,156 A | 7/1996 | Levy et al. |
| 5,768,192 A | 6/1998 | Eitan |
| 5,936,274 A | 8/1999 | Forbes et al. |

(Continued)

FOREIGN PATENT DOCUMENTS

WO WO2009091786 A1 7/2009

OTHER PUBLICATIONS

Kau, D.C. et al., "A Stackable Cross Point Phase Change Memory," IEEE, pp. IEDM09-617 to IEDM09-620, (2009).

(Continued)

*Primary Examiner* — Vu A Vu
(74) *Attorney, Agent, or Firm* — The Marbury Law Group, PLLC

(57) ABSTRACT

First stacked rail structures including a first conductive rail, a selector rail, and a sacrificial material rail and separated by first trenches are formed over a substrate. First dielectric isolation structures are formed in the first trenches. Second trenches are formed, which divides the first stacked rail structures above the first conductive rails. Second dielectric isolation structures in the second trenches. Pillar structures are formed, which include a respective vertical stack of a selector element and a sacrificial material pillar. The sacrificial material pillars are replaced with phase change memory material pillars by a damascene method that deposits and planarizes a phase change memory material. Second conductive rails are formed over the phase change memory material pillars. Sidewalls of the phase change memory material pillars are not subjected to etch damage, thereby enhancing electrical characteristics of the phase change memory material pillars.

5 Claims, 23 Drawing Sheets

(56) References Cited

U.S. PATENT DOCUMENTS

| | | |
|---|---|---|
| 6,011,725 A | 1/2000 | Eitan |
| 6,015,738 A | 1/2000 | Levy et al. |
| 6,285,055 B1 | 9/2001 | Gosain et al. |
| 6,580,124 B1 | 6/2003 | Cleeves et al. |
| 6,853,049 B2 | 2/2005 | Herner |
| 6,881,994 B2 | 4/2005 | Lee et al. |
| 7,285,464 B2 | 10/2007 | Herner et al. |
| 7,378,870 B2 | 5/2008 | Mouttet |
| 7,579,232 B1 | 8/2009 | Ping et al. |
| 7,733,685 B2 | 6/2010 | Scheuerlein et al. |
| 7,745,312 B2 | 6/2010 | Herner et al. |
| 7,800,933 B2 | 9/2010 | Kumar et al. |
| 7,830,697 B2 | 11/2010 | Herner |
| 7,851,851 B2 | 12/2010 | Mokhlesi et al. |
| 7,906,392 B2 | 3/2011 | Dunton et al. |
| 7,923,812 B2 | 4/2011 | Scheuerlein |
| 7,927,977 B2 | 4/2011 | Makala et al. |
| 7,943,515 B2 | 5/2011 | Scheuerlein |
| 8,097,498 B2 | 1/2012 | Purayath et al. |
| 8,148,230 B2 | 4/2012 | Dunton et al. |
| 8,168,535 B2 * | 5/2012 | Bae .................. H04L 45/06 257/E21.585 |
| 8,222,091 B2 | 7/2012 | Purayath et al. |
| 8,345,472 B2 | 1/2013 | Lee et al. |
| 8,349,681 B2 | 1/2013 | Alsmeier et al. |
| 9,130,163 B2 * | 9/2015 | Tang .................. H01L 27/2409 |
| 9,343,507 B2 | 5/2016 | Takaki |
| 2005/0029627 A1 | 2/2005 | Dennison |
| 2005/0052915 A1 | 3/2005 | Herner et al. |
| 2005/0073010 A1 | 4/2005 | Lai et al. |
| 2006/0073631 A1 | 4/2006 | Karpov et al. |
| 2006/0246606 A1 | 11/2006 | Hsu et al. |
| 2006/0292301 A1 | 12/2006 | Herner |
| 2007/0026566 A1 | 2/2007 | Karpov et al. |
| 2007/0029607 A1 | 2/2007 | Kouznetzov |
| 2007/0072360 A1 | 3/2007 | Kumar et al. |
| 2007/0148869 A1 | 6/2007 | Lee |
| 2008/0246161 A1 | 10/2008 | Dennison |
| 2008/0254576 A1 | 10/2008 | Hsia et al. |
| 2008/0316809 A1 | 12/2008 | Herner |
| 2009/0179310 A1 | 7/2009 | Dunton et al. |
| 2009/0181515 A1 | 7/2009 | Herner et al. |
| 2010/0059796 A1 | 3/2010 | Scheuerlein |
| 2010/0203672 A1 | 8/2010 | Eun et al. |
| 2012/0147648 A1 | 6/2012 | Scheuerlein |
| 2012/0155161 A1 | 6/2012 | Lee et al. |
| 2015/0243708 A1 * | 8/2015 | Ravasio .............. H01L 27/2463 257/4 |
| 2016/0204343 A1 * | 7/2016 | Gotti .................. H01L 45/1253 257/4 |
| 2016/0343721 A1 | 11/2016 | Briggs et al. |
| 2016/0343723 A1 | 11/2016 | Briggs et al. |

OTHER PUBLICATIONS

Wong, H.S. P. et al., "Phase Change Memory," Proceedings of the IEEE, vol. 98, No. 12, pp. 2201-2227, (2010).

U.S. Appl. No. 15/478,637, filed Apr. 4, 2017, Sandisk Technologies LLC.

U.S. Appl. No. 15/637,357, filed Jun. 29, 2017, Sandisk Technologies LLC.

U.S. Appl. No. 15/843,777, filed Dec. 15, 2017, Sandisk Technologies LLC.

U.S. Appl. No. 15/844,005, filed Dec. 15, 2017, Sandisk Tehcnologies LLC.

U.S. Appl. No. 15/888,645, filed Feb. 5, 2018, Sandisk Tehcnologies LLC.

* cited by examiner

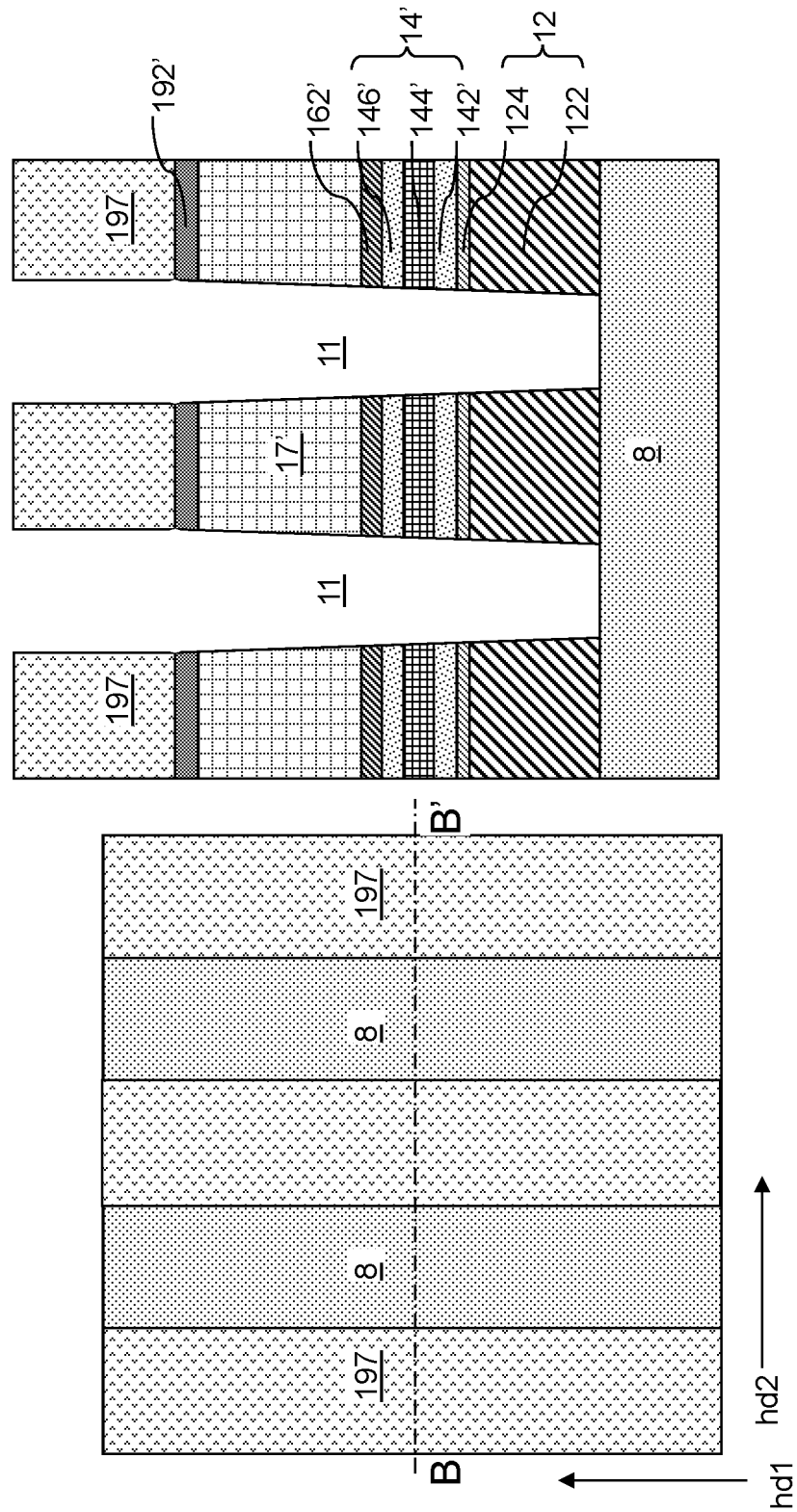

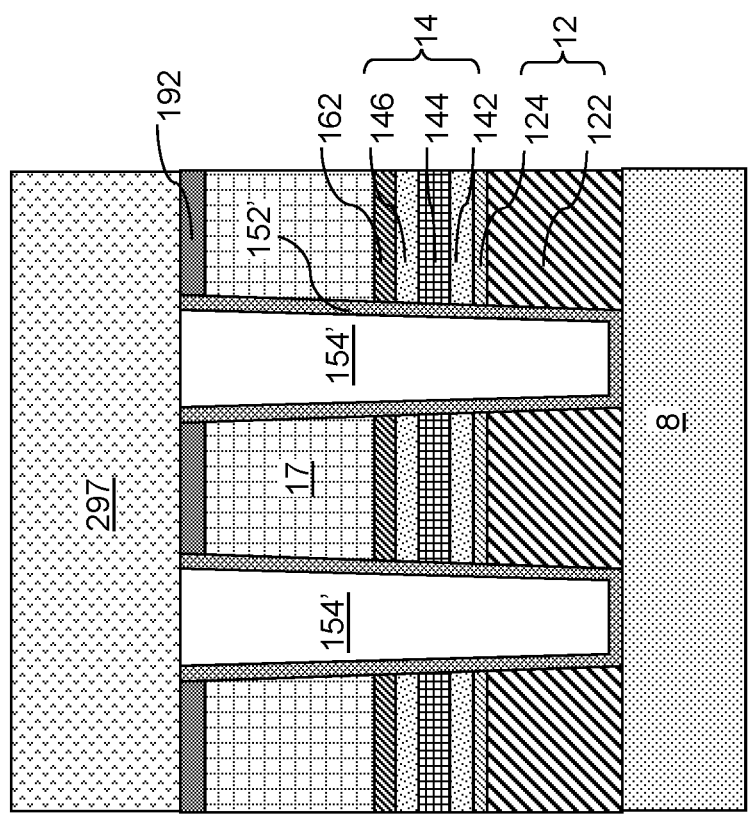
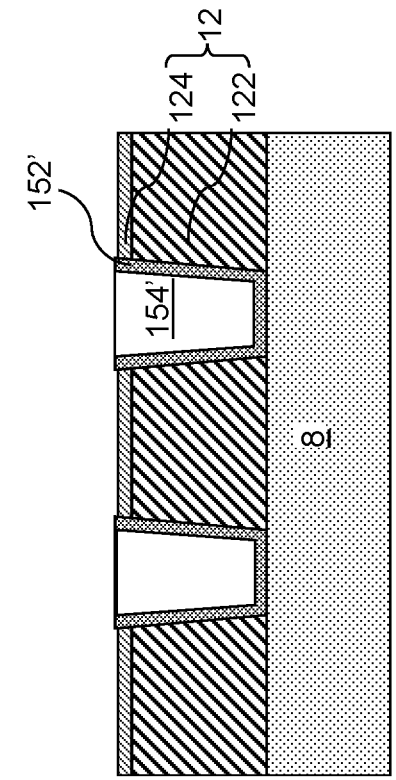
FIG. 6C
FIG. 6D

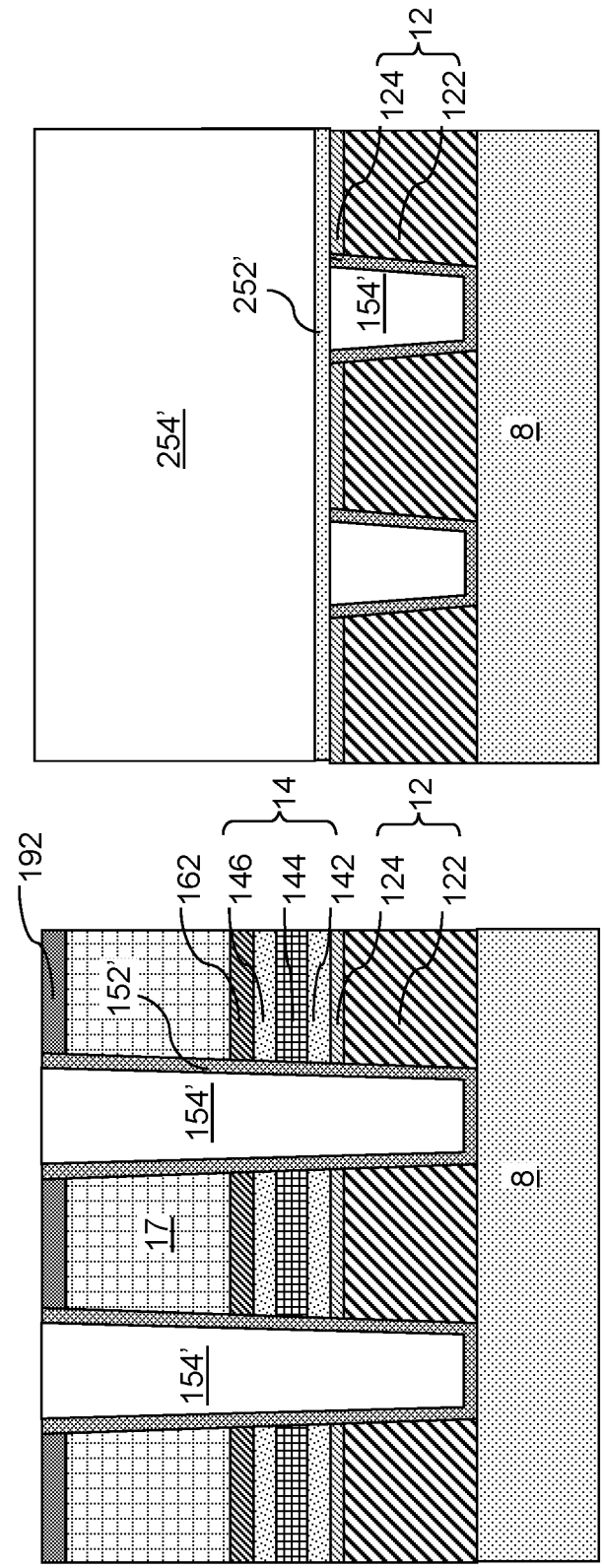

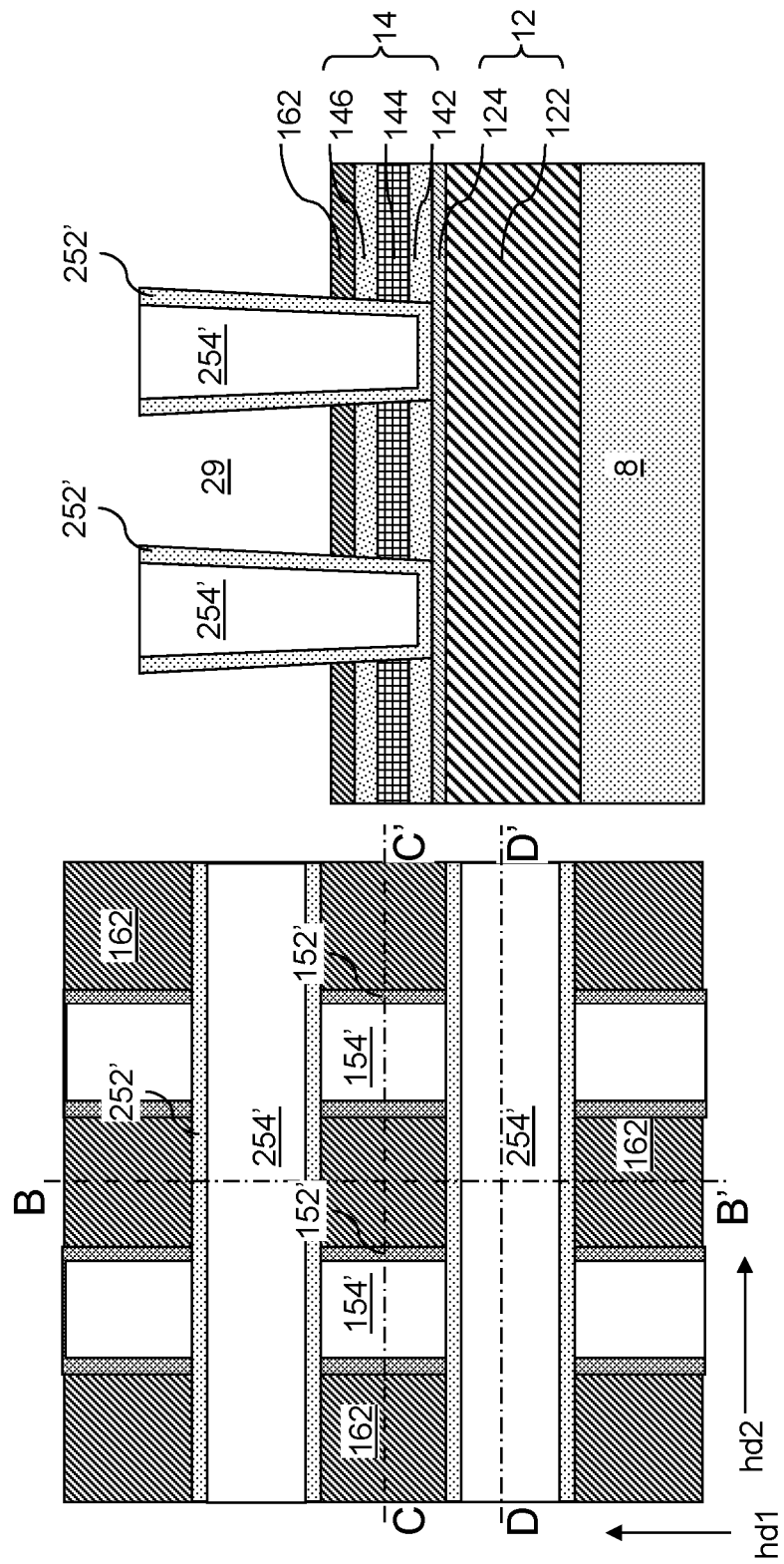

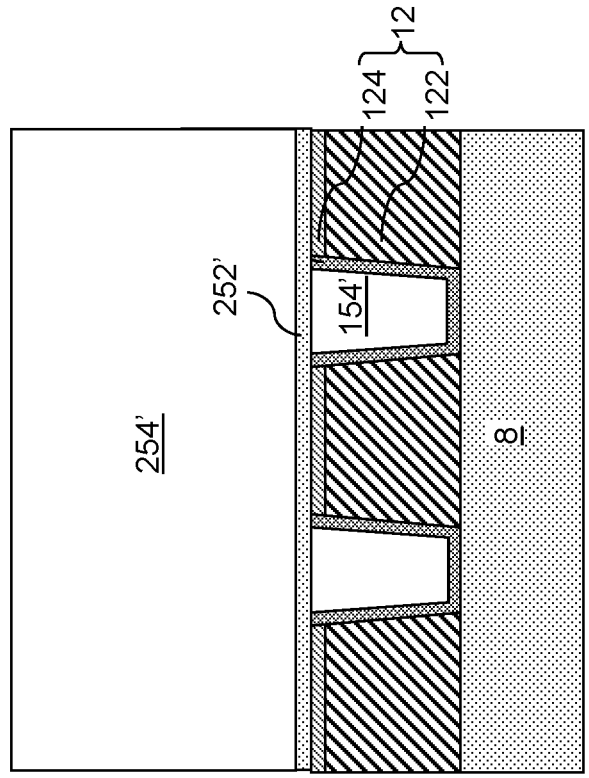
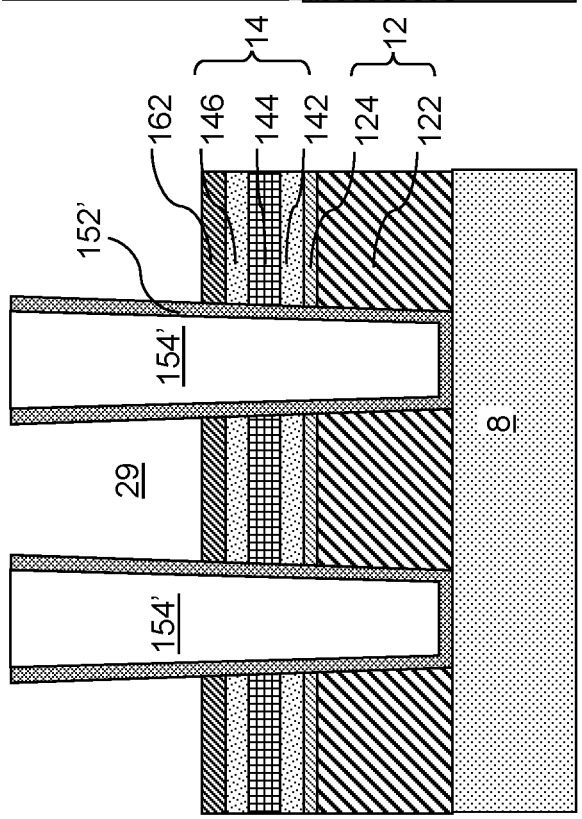
FIG. 8D
FIG. 8C

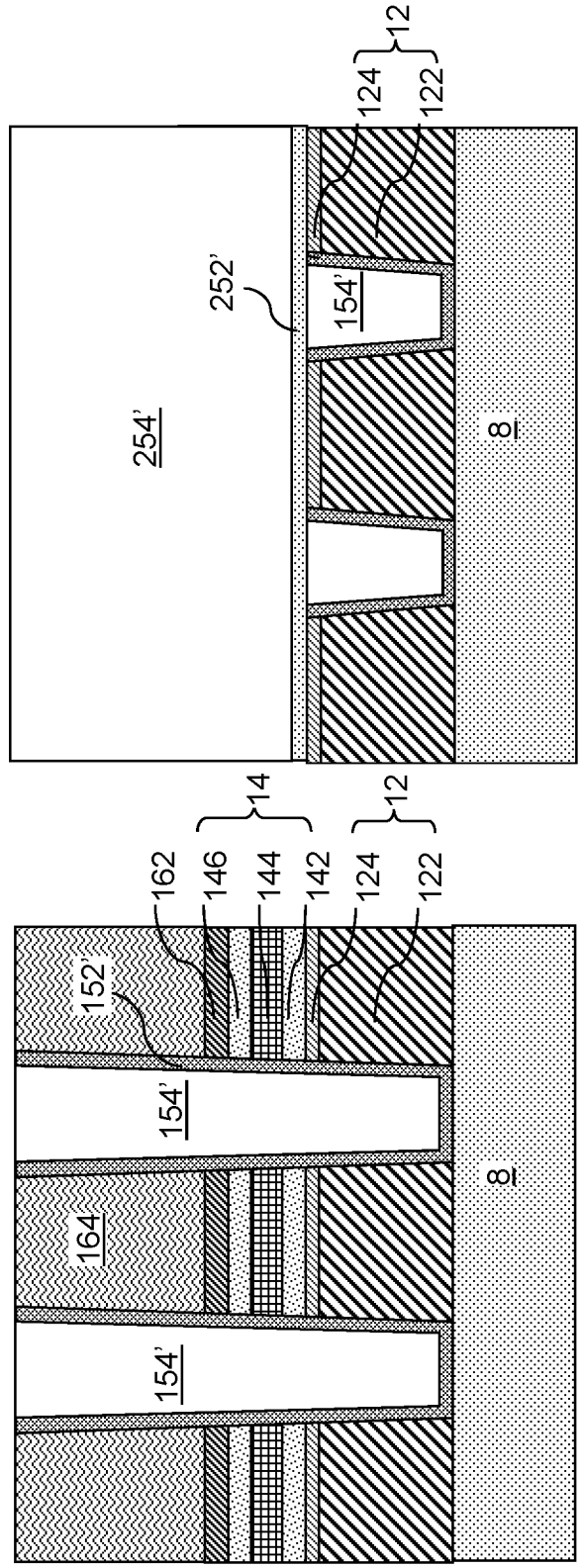

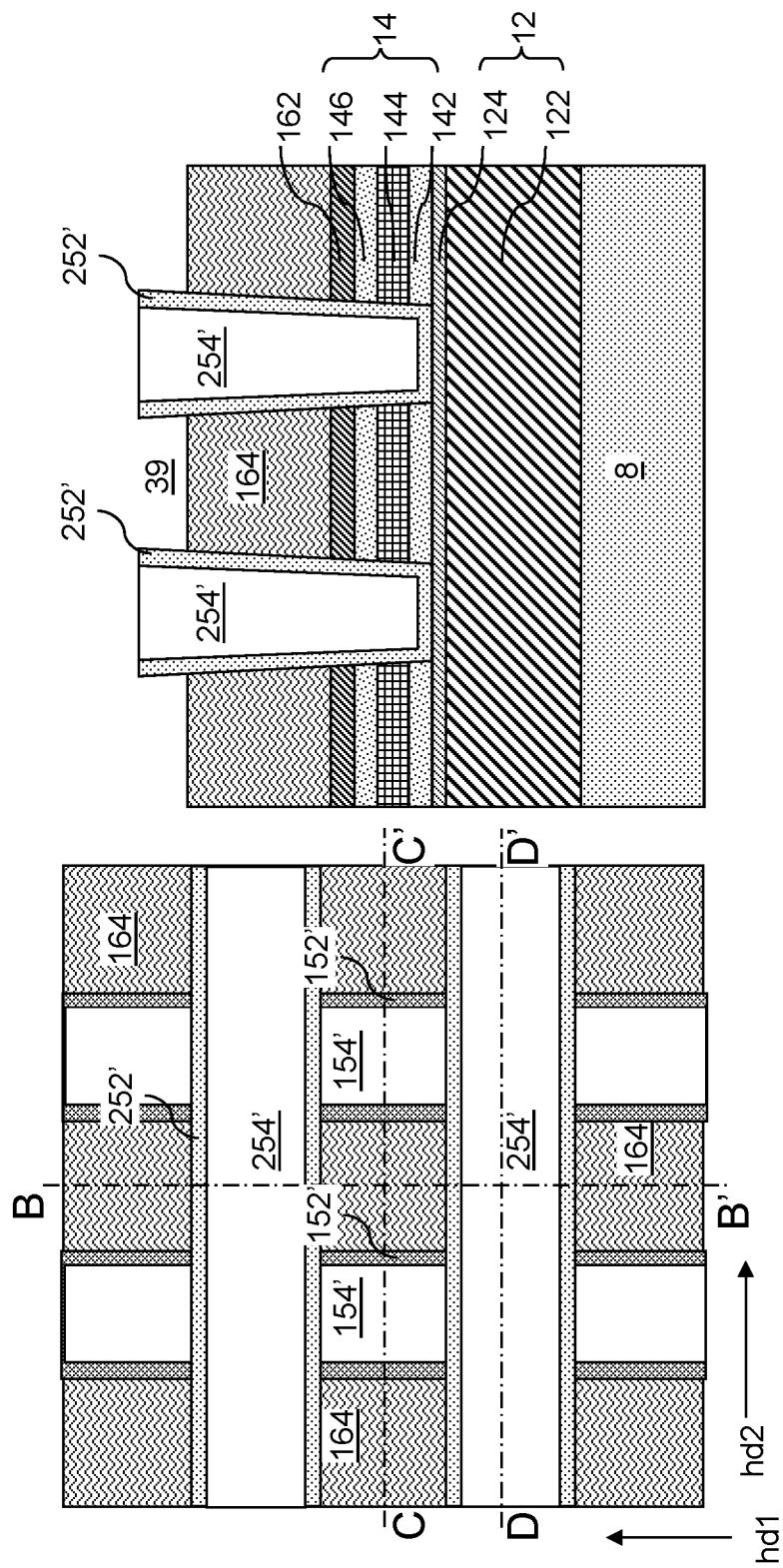

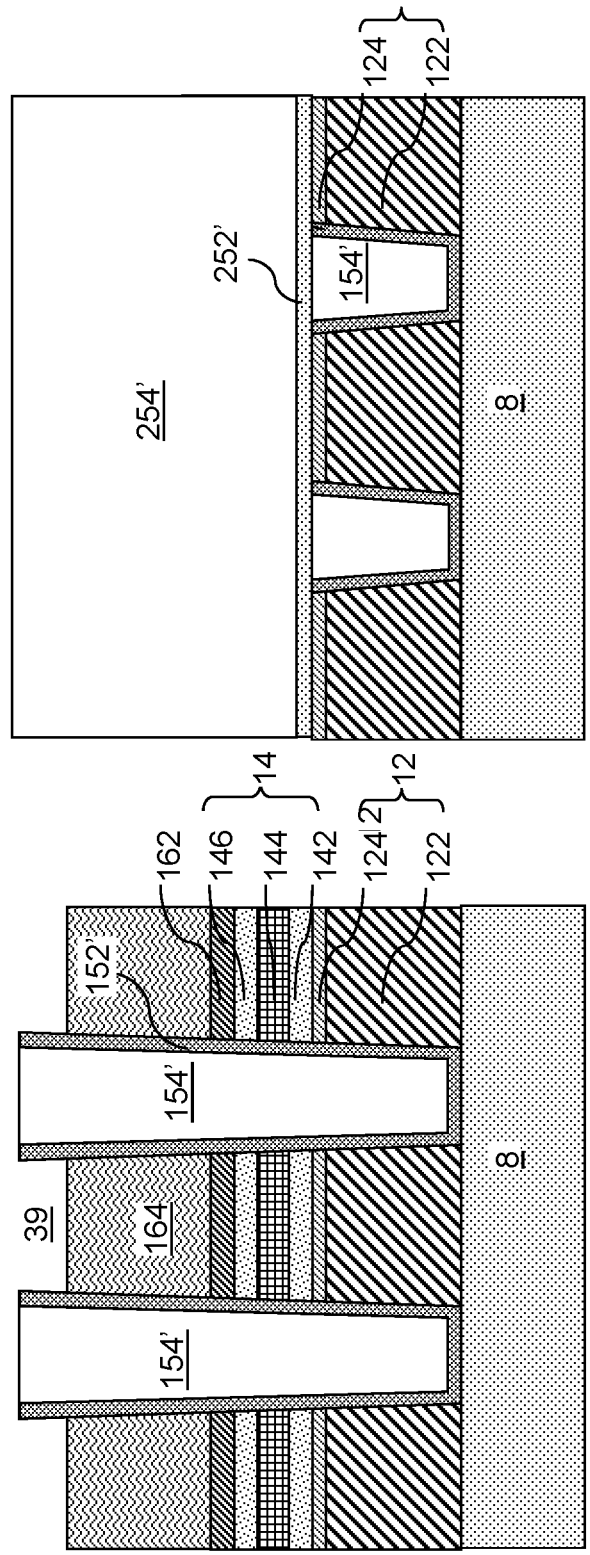

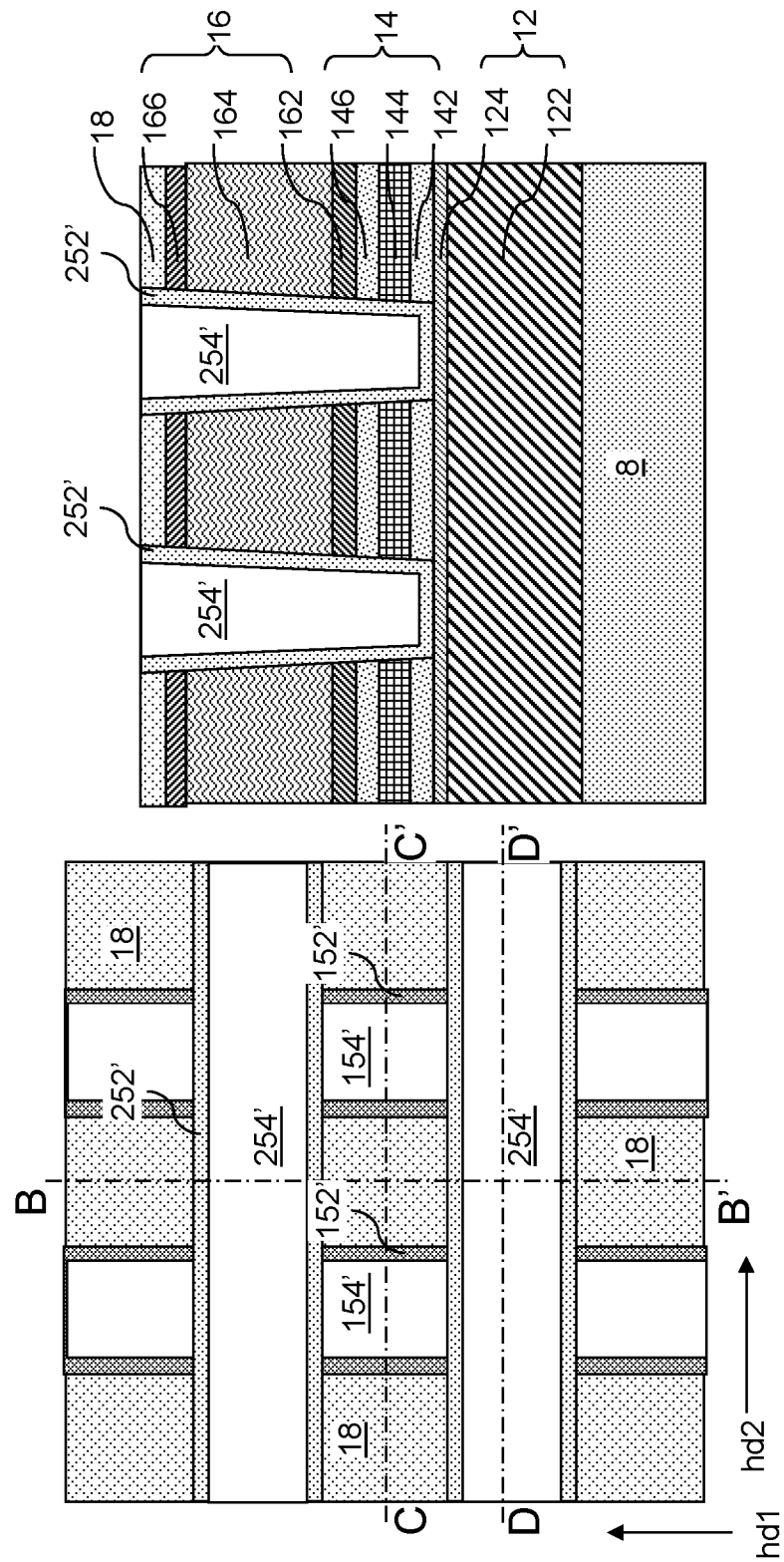

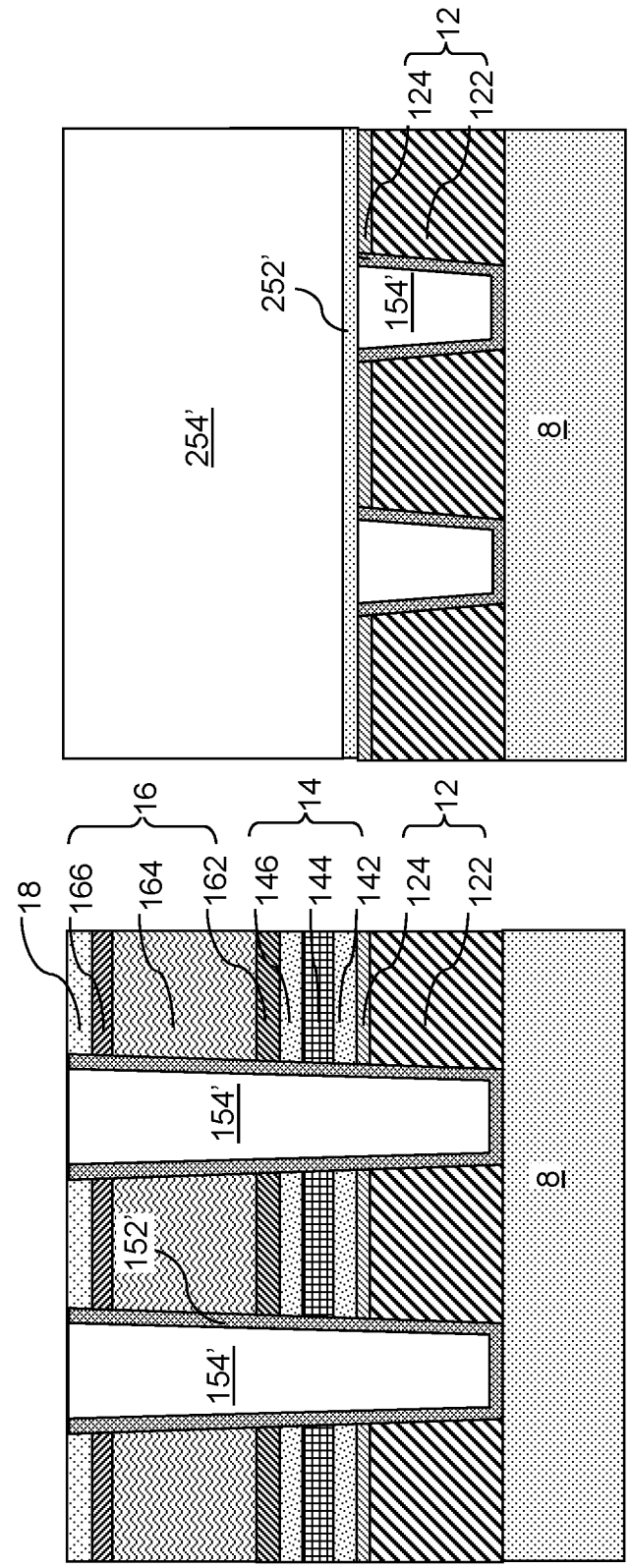

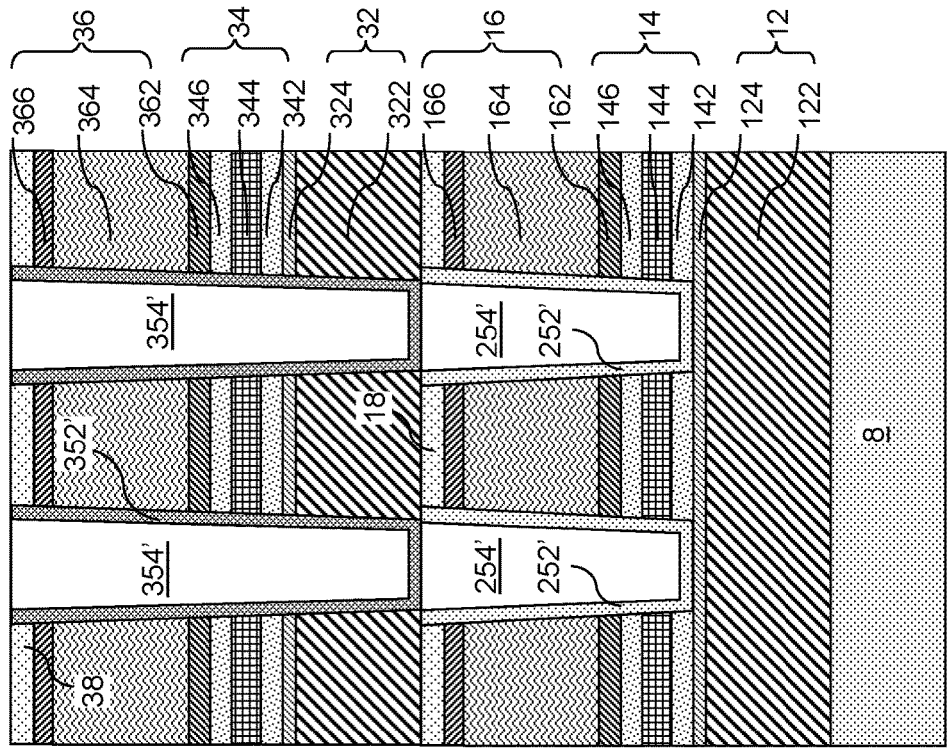
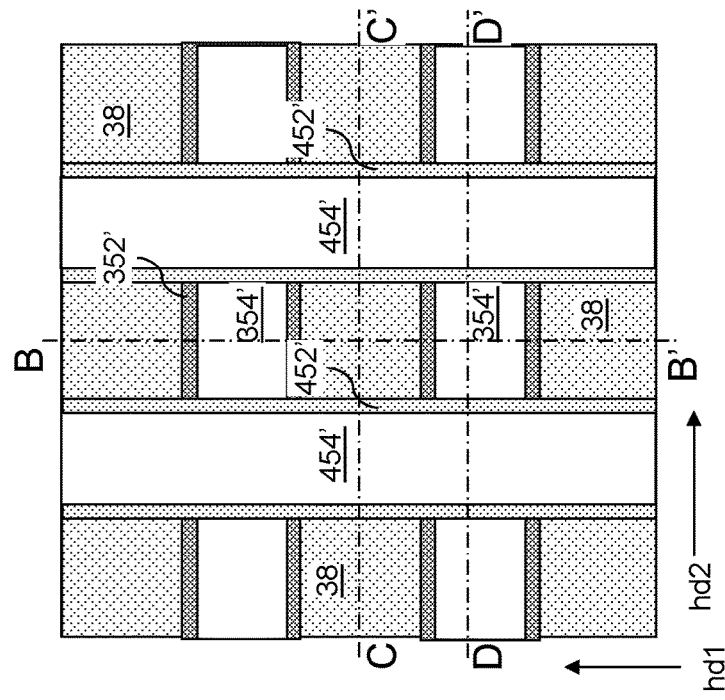
FIG. 12B
FIG. 12A

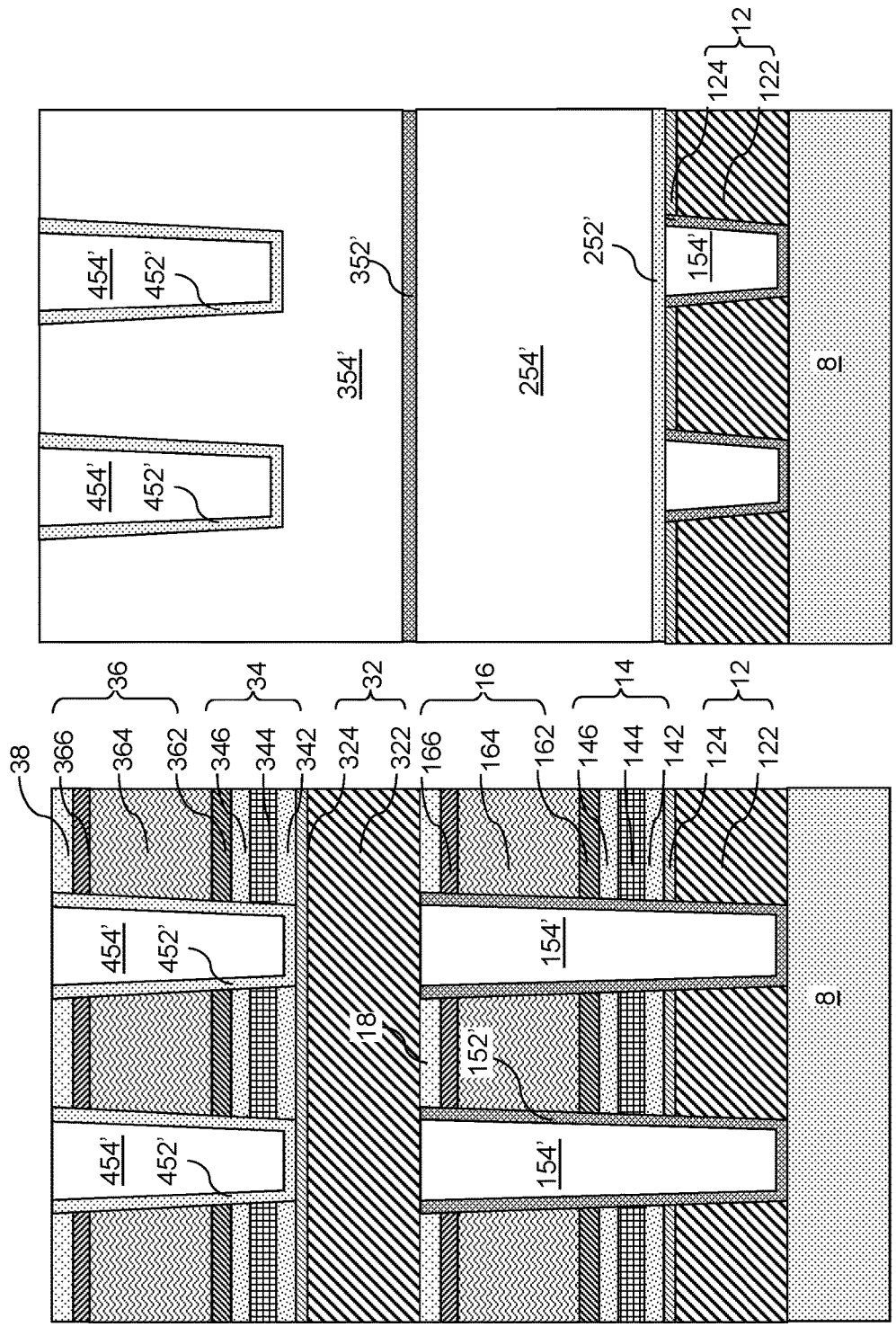

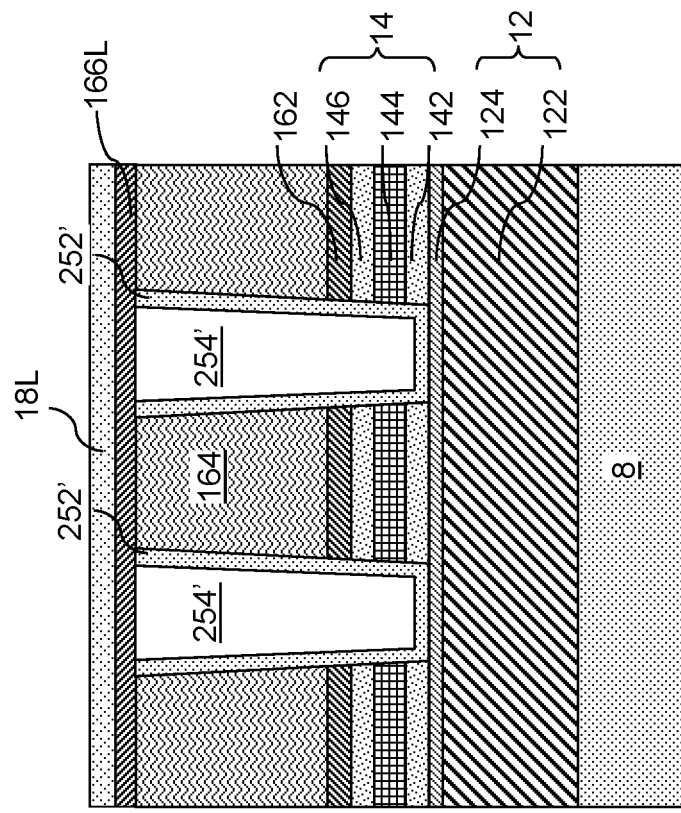
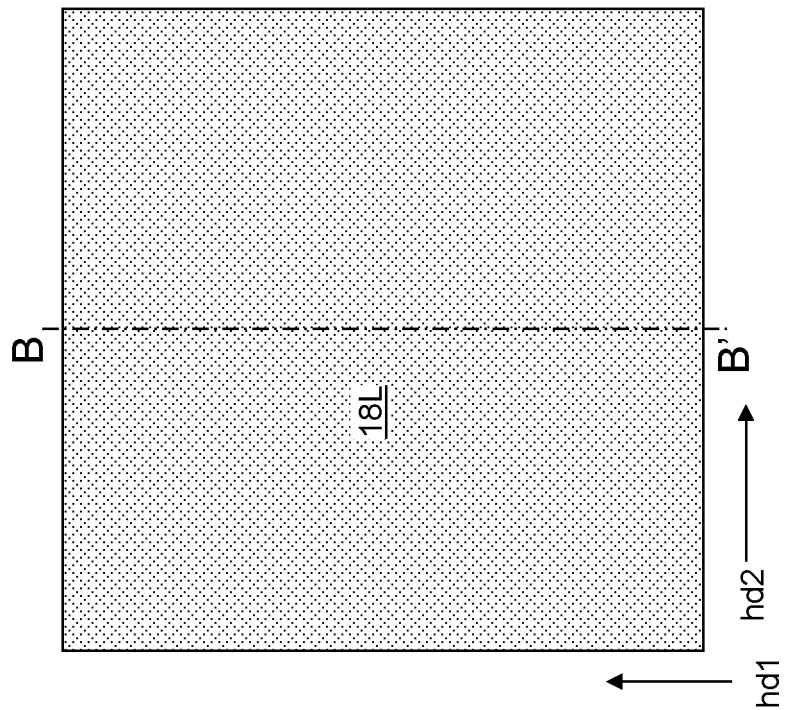
FIG. 13B
FIG. 13A

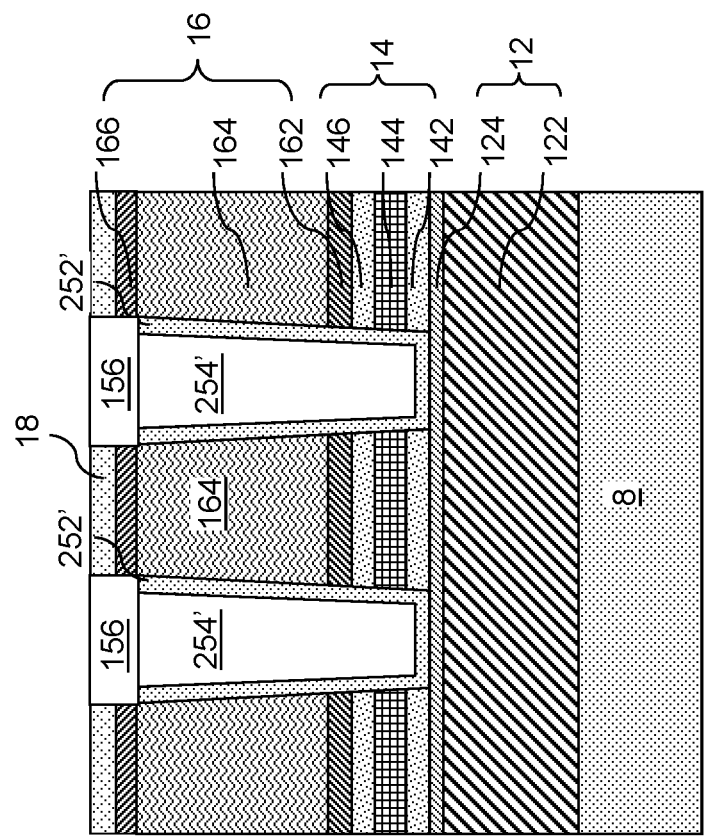
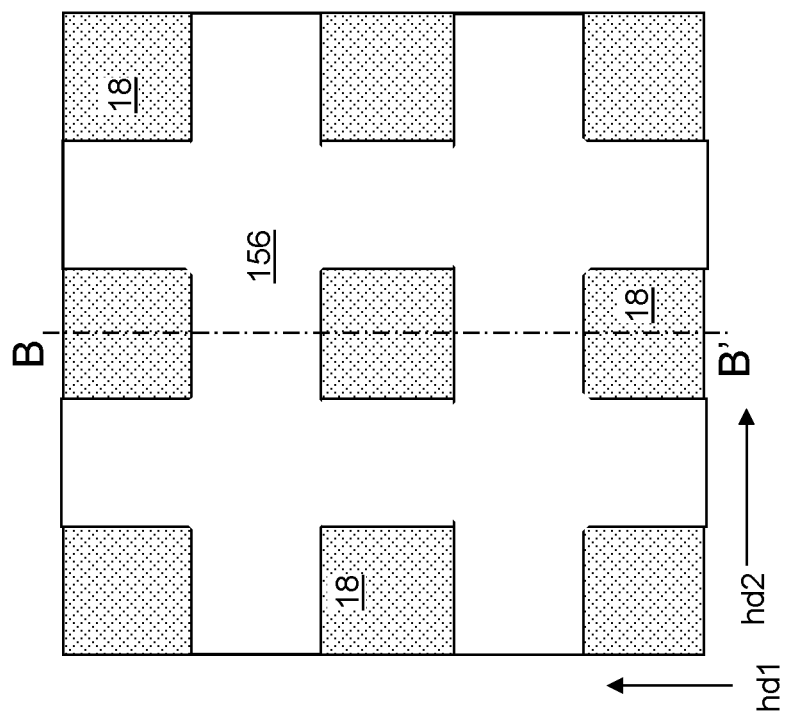
FIG. 14B
FIG. 14A

US 10,468,596 B2

DAMASCENE PROCESS FOR FORMING THREE-DIMENSIONAL CROSS RAIL PHASE CHANGE MEMORY DEVICES

FIELD

The present disclosure relates generally to the field of semiconductor devices and specifically to a damascene process for forming three-dimensional cross rail phase change memory structures.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a method of manufacturing a phase change memory device is provided, which comprises: forming first stacked rail structures laterally extending along a first horizontal direction and laterally spaced apart by first trenches along a second horizontal direction over a substrate, wherein each of the first stacked rail structures comprises a first conductive rail, a first selector rail, and a first sacrificial material rail; forming first dielectric isolation structures in the first trenches; forming second trenches laterally extending along the second horizontal through the first sacrificial material rails, the first selector rails, and the first dielectric isolation structures; forming second dielectric isolation structures in the second trenches, wherein remaining portions of the first sacrificial material rails and first selector rails constitute in-process pillar structures including a respective vertical stack of a first selector element and a first sacrificial material pillar; forming first cavities by removing the first sacrificial material pillars without removing the first and second dielectric isolation structures and the first selector elements; forming first phase change memory material pillars in the first cavities by a damascene method that deposits a first phase change memory material in the first cavities and removes portions of the first phase change memory material from outside the first cavities; and forming second conductive rails laterally extending along the second horizontal direction over the first phase change memory material pillars.

According to another aspect of the present disclosure, a method of manufacturing a phase change memory device comprises forming a selector layer over a substrate, forming a sacrificial material layer over the selector layer, patterning the selector layer and the sacrificial material layer to form discrete selector element and sacrificial material stacks separated by openings, forming dielectric isolation structures in the openings, forming cavities by removing the sacrificial material portions without removing the dielectric isolation structures and the selector portions, and forming phase change memory material portions in the cavities by a damascene method that deposits a phase change memory material in the cavities.

BRIEF DESCRIPTION OF THE DRAWINGS

FIG. 2A is a vertical cross-sectional view of the exemplary structure after formation of first stacked rail structures laterally spaced by first trenches through the first layer stack according to an embodiment of the present disclosure.

FIG. 2B is a vertical cross-sectional view of the exemplary structure along the vertical plane B-B' of FIG. 2A.

FIG. 6C is a vertical cross-sectional view of the exemplary structure along the vertical plane C-C' of FIG. 6A.

FIG. 6D is a vertical cross-sectional view of the exemplary structure along the vertical plane D-D' of FIG. 6A.

FIG. 7C is a vertical cross-sectional view of the exemplary structure along the vertical plane C-C' of FIG. 7A.

FIG. 7D is a vertical cross-sectional view of the exemplary structure along the vertical plane D-D' of FIG. 7A.

FIG. 8A is a vertical cross-sectional view of the exemplary structure after removal of first sacrificial material pillars according to an embodiment of the present disclosure.

FIG. 8B is a vertical cross-sectional view of the exemplary structure along the vertical plane B-B' of FIG. 8A.

FIG. 8C is a vertical cross-sectional view of the exemplary structure along the vertical plane C-C' of FIG. 8A.

FIG. 8D is a vertical cross-sectional view of the exemplary structure along the vertical plane D-D' of FIG. 8A.

FIG. 9C is a vertical cross-sectional view of the exemplary structure along the vertical plane C-C' of FIG. 9A.

FIG. 9D is a vertical cross-sectional view of the exemplary structure along the vertical plane D-D' of FIG. 9A.

FIG. 10A is a vertical cross-sectional view of the exemplary structure after vertically recessing the first phase change memory material pillars to provide recess volumes according to an embodiment of the present disclosure.

FIG. 10B is a vertical cross-sectional view of the exemplary structure along the vertical plane B-B' of FIG. 10A.

FIG. 10C is a vertical cross-sectional view of the exemplary structure along the vertical plane C-C' of FIG. 10A.

FIG. 10D is a vertical cross-sectional view of the exemplary structure along the vertical plane D-D' of FIG. 10A.

FIG. 11A is a vertical cross-sectional view of the exemplary structure after forming layer stacks including an upper conductive liner layer and a barrier material layer in the recess volumes according to an embodiment of the present disclosure.

FIG. 11B is a vertical cross-sectional view of the exemplary structure along the vertical plane B-B' of FIG. 11A.

FIG. 11C is a vertical cross-sectional view of the exemplary structure along the vertical plane C-C' of FIG. 11A.

FIG. 11D is a vertical cross-sectional view of the exemplary structure along the vertical plane D-D' of FIG. 11A.

FIG. 12A is a vertical cross-sectional view of the exemplary structure after forming a second-tier structure including an additional array of pillar structures according to an embodiment of the present disclosure.

FIG. 12B is a vertical cross-sectional view of the exemplary structure along the vertical plane B-B' of FIG. 12A.

FIG. 12C is a vertical cross-sectional view of the exemplary structure along the vertical plane C-C' of FIG. 12A.

FIG. 12D is a vertical cross-sectional view of the exemplary structure along the vertical plane D-D' of FIG. 12A.

FIG. 13A is a vertical cross-sectional view of an alternative embodiment of the exemplary structure after forming a layer stack of a continuous upper conductive liner layer and a continuous barrier material layer according to an embodiment of the present disclosure.

FIG. 13B is a vertical cross-sectional view of the exemplary structure along the vertical plane B-B' of FIG. 13A.

FIG. 14A is a vertical cross-sectional view of the alternative embodiment of the exemplary structure after forming layer stacks of an upper conductive liner layer and a barrier material layer and an insulating matrix layer according to an embodiment of the present disclosure.

FIG. 14B is a vertical cross-sectional view of the exemplary structure along the vertical plane B-B' of FIG. 14A.

DETAILED DESCRIPTION

Figure 1B:
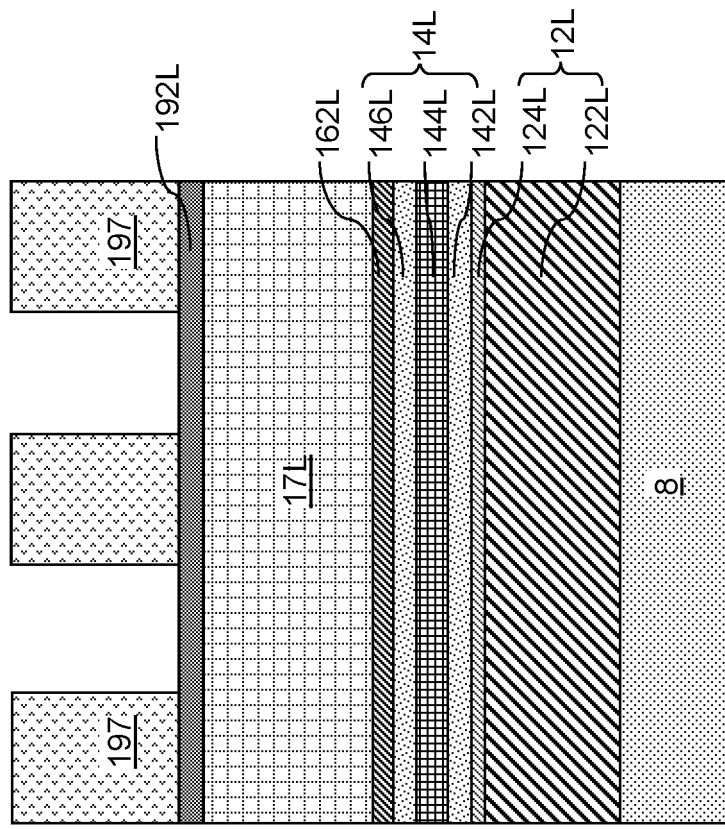
FIG. 1B is a vertical cross-sectional view of the exemplary structure along the vertical plane B-B' of FIG. 1A.

As discussed above, the present disclosure is directed to a damascene process for forming three-dimensional cross rail phase change memory devices, the various aspects of which are described below. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 1A:
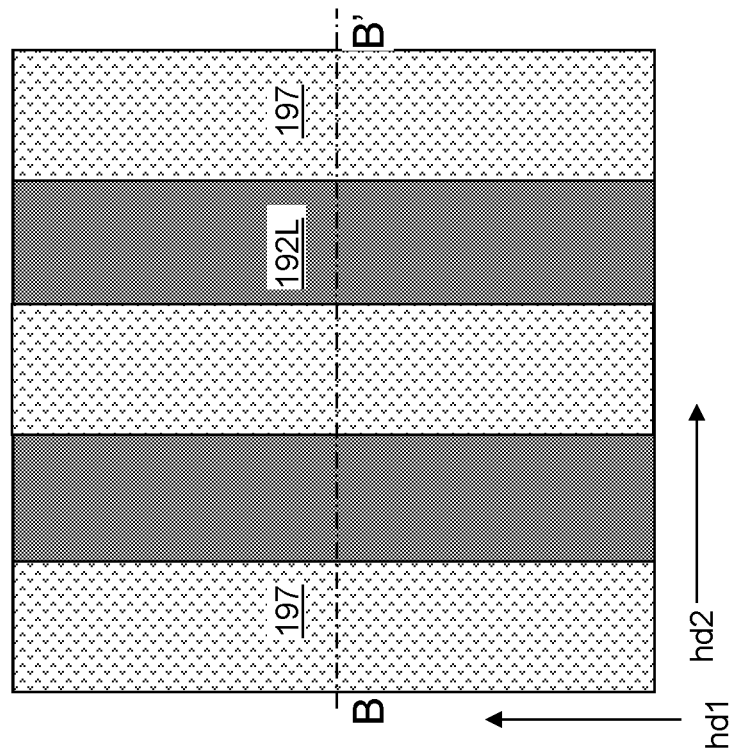
FIG. 1A is a top-down view of an exemplary structure for forming a three-dimensional phase change memory device after formation of a first layer stack and application and patterning of a first photoresist layer over a substrate according to an embodiment of the present disclosure.

Referring to FIGS. 1A and 1B, an exemplary structure for forming a three-dimensional phase change memory device is illustrated, which includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices (e.g., driver circuit devices). Memory cells are subsequently formed in the memory array region.

A first vertical stack (12L, 14L, 162L, 17L, 192L) is formed over the substrate 8. The first vertical stack (12L, 14L, 162L, 17L, 192L) can include a first conductive material layer 12L, a first selector layer 14L, an optional first lower conductive liner layer 162L, a first sacrificial material layer 17L, and a first hard mask layer 192L.

The first conductive material layer 12L includes at least one conductive material layer, which can be at least one metallic material layer. For example, the first conductive material layer 12L can include a layer stack, from bottom to top, of a first metal layer 122L (such as a tungsten layer) and a first metal nitride layer 124L (such as a tungsten nitride layer or a titanium nitride layer). The thickness of the first metal layer 122L can be in a range from 20 nm to 100 nm, such as from 30 nm to 70 nm, although lesser and greater thicknesses can also be employed. The thickness of the first metal nitride layer 124L can be in a range from 1 nm to 10 nm, such as from 1.5 nm to 5 nm, although lesser and greater thicknesses can also be employed.

The first selector layer 14L includes a non-Ohmic material that provides electrical connection of electrical isolation depending on the magnitude and/or the polarity of an externally applied voltage bias thereacross. In one embodiment, the first selector layer 14L includes at least one threshold switch material layer. The at least one threshold switch material layer includes any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, C, and Si, such as a Ge—Se—As compound semiconductor material. The ovonic threshold switch material layer can include a first ovonic threshold switch material layer 144L which contains any ovonic threshold switch material. In one embodiment, the first ovonic threshold switch material layer 144L can include, and/or can consist essentially of, a GeSeAs alloy, a GeSe alloy, a SeAs alloy, a GeTe alloy, or a SiTe alloy. In another embodiment, the ovonic threshold switch material can be doped with trace amounts of rare-earth metals.

In one embodiment, the material of the first ovonic threshold switch material layer 144L can be selected such that the resistivity of the first ovonic threshold switch material layer 144L decreases at least by two orders of magnitude (i.e., by more than a factor of 100) upon application of an external bias voltage that exceeds a critical bias voltage magnitude (also referred to as a threshold voltage or $V_t$). In one embodiment, the composition and the thickness of the first ovonic threshold switch material layer 144L can be selected such that the critical bias voltage magnitude can be in a range from 1 V to 4 V, although lesser and greater voltages can also be employed for the critical bias voltage magnitude. The thickness of the first ovonic threshold switch material layer 144L can be, for example, in a range from 1 nm to 40 nm, such as from 2 nm to 20 nm, although lesser and greater thicknesses can also be employed.

The first selector layer 14L can include an optional first upper barrier material layer 146L overlying the first ovonic threshold switch material layer 144L and an optional first lower barrier material layer 142L underlying the first ovonic threshold switch material layer 144L. The optional first upper and/or lower barrier material layers (146L, 142L) include a material that suppresses diffusion of the material of the first ovonic threshold switch material layer 144L. For example, the first upper and/or lower barrier material layers (146L, 142L) can include amorphous carbon or diamondlike carbon (DLC). In one embodiment, the first upper barrier material layers 146L can include an upper amorphous carbon layer that contacts a top surface of the first ovonic threshold switch material layer 144L, and the first lower barrier material layer 142L can include a lower amorphous carbon layer that contacts a bottom surface of the first ovonic threshold switch material layer 144L. The thickness of the first upper barrier material layers 146L can be in a range from 4 nm to 40 nm, such as from 8 nm to 20 nm, although lesser and greater thicknesses can also be employed. The thickness of the first lower barrier material layer 142L can be in a range from 4 nm to 40 nm, such as from 8 nm to 20 nm, although lesser and greater thicknesses can also be employed.

The optional first lower conductive liner layer 162L, if present, includes a conductive metallic material. In one embodiment, the first lower conductive liner layer 162L can include a metal, such as tungsten, or a conductive metallic nitride such as titanium nitride, tantalum nitride, or tungsten nitride. The thickness of the first lower conductive layer 162L can be in a range from 1 nm to 10 nm, such as from 1.5 nm to 5 nm, although lesser and greater thicknesses can also be employed.

Alternatively or additionally, the first selector layer 14L may include an alternative non-Ohmic material layer such as a p-n pr p-i-n junction diode layers (e.g., p and n type doped semiconductor layers). In this case, the first selector layer 14L becomes conductive only under electrical bias condition of one polarity, and becomes electrically non-conductive under electrical bias condition of the opposite polarity.

The first sacrificial material layer 17L includes a sacrificial material that can be subsequently removed selective to the material of an immediately underlying material layer, which can be the first lower conductive liner layer 162L. As used herein, a "sacrificial material" refers to a material that is removed during a subsequent processing step. Sacrificial materials that can be employed for the first sacrificial material layer 17L include, but are not limited to, an amorphous semiconductor material (e.g., amorphous silicon), a polycrystalline semiconductor material (e.g., polysilicon), carbon, silicon nitride, etc. The first sacrificial material layer 17L can be deposited by chemical vapor deposition, physical vapor deposition, vacuum evaporation, or spin coating. The thickness of the first sacrificial material layer 17L can be in a range from 30 nm to 250 nm, such as from 50 nm to 150 nm, although lesser and greater thicknesses can also be employed.

The optional first hard mask layer 192L includes a hard mask material that can be employed as a planarization stopping structure in a subsequent planarization process. The first hard mask layer 192L can include a material selected from a metal, a dielectric material, or a semiconductor material. For example, the first hard mask layer 192L can include silicon nitride, a dielectric metal oxide, or a metal. In one embodiment, the first hard mask layer 192L can include silicon nitride. The thickness of the first hard mask layer 192L can be in a range from 3 nm to 30 nm, such as from 6 nm to 15 nm, although lesser and greater thicknesses can also be employed.

A first photoresist layer 197 can be applied over the first vertical stack (12L, 14L, 162L, 17L, 192L), and can be lithographically patterned to form a line and space pattern. For example, the first photoresist layer 197 can be patterned to form line trenches that laterally extend along a first horizontal direction hd1 and laterally spaced apart along a second horizontal direction hd2. The line trenches can have a uniform width that is invariant with translation along the first horizontal direction hd1. The pattern in the first photoresist layer 197 can be a periodic pattern that is repeated along the second horizontal direction hd2 with a pitch that is equal to the sum of the width of a line trench in the first photoresist layer 197 and the width of a patterned portion of the first photoresist layer 197. The pitch can be in a range from 32 nm to 600 nm, although lesser and greater pitches can also be employed.

Referring to FIGS. 2A and 2B, an anisotropic etch process is performed employing the patterned portions of the first photoresist layer 197 as an etch mask. The anisotropic etch process etches through portions of the first vertical stack (12L, 14L, 162L, 17L, 192L) that are not masked by the first photoresist layer 197. The chemistry of the anisotropic etch process can be sequentially modified to etch through the various material layers of the first vertical stack (12L, 14L, 162L, 17L, 192L). The anisotropic etch process can stop at, or below, the top surface of the substrate 8. First trenches 11 laterally extending along the first horizontal direction hd1 are formed by the anisotropic etch. The first trenches 11 can be line trenches having a uniform vertical cross-sectional shape within vertical planes that are perpendicular to the first horizontal direction hd1. The uniform vertical cross-sectional shape of each first trench 11 can be invariant with translation along the first horizontal direction hd1. Each first trench 11 can vertically extend from the horizontal plane including the bottom surface of the first photoresist layer 197 to the horizontal plane including the top surface of the substrate 8.

Remaining portions of the first vertical stack (12L, 14L, 162L, 17L, 192L) include first stacked rail structures (12, 14', 162', 17', 192'), each of which laterally extends along the first horizontal direction hd1. The first stacked rail structures (12, 14', 162', 17', 192') are laterally spaced apart by the first trenches 11 along the second horizontal direction hd2. As used herein, a "rail" or a "rail structure" refers to a structure that extends along a lengthwise direction, and optionally with a uniform cross-sectional shape within planes that are perpendicular to the lengthwise direction that is invariant under translation along the lengthwise direction. As used herein, a "stacked rail" or a "stacked rail structure" refers to a contiguous stack of at least two rails that laterally extend along a same lengthwise direction.

Each first stacked rail structure (12, 14', 162', 17', 192') includes, from bottom to top, a first conductive rail 12 that is a patterned portion of the first conductive material layer 12L, a first selector rail 14' that is a patterned portion of the first selector layer 14L, an optional first lower conductive liner strip 162' that is a patterned portion of the first lower conductive liner layer 162L, a first sacrificial material rail 17' that is a patterned portion of the first sacrificial material layer 17L, and an optional first hard mask strip 192' that is a patterned portion of the first hard mask layer 192L. As used herein, a "strip" refers to a rail having a thickness that is less than the width. The first stacked rail structures (12, 14', 162', 17', 192') laterally extend along the first horizontal direction hd1, are laterally spaced among one another by the first trenches 11, and are located over the substrate 8.

In one embodiment, each of the first conductive rails 12 can include a vertical stack of a first metal rail 122 that is a patterned portion of the first metal layer 122L and a first metal nitride strip 124 that is a patterned portion of the first metal nitride layer 124L. In one embodiment, each first selector rail 14' can include a vertical stack of a first lower barrier material strip 142', a first threshold switch material rail, such as a first ovonic threshold switch material rail 144', and a first upper barrier material strip 146'. The first lower barrier material strip 142' is a patterned portion of an optional first lower barrier material layer 142L. The first ovonic threshold switch material rail 144' is a patterned portion of the first ovonic threshold switch material layer 144L. The first upper barrier material strip 146' is a patterned portion of the optional first upper barrier material layer 146L. The first photoresist layer 197 can be subsequently removed, for example, by ashing.

Figures 3A, 3B:
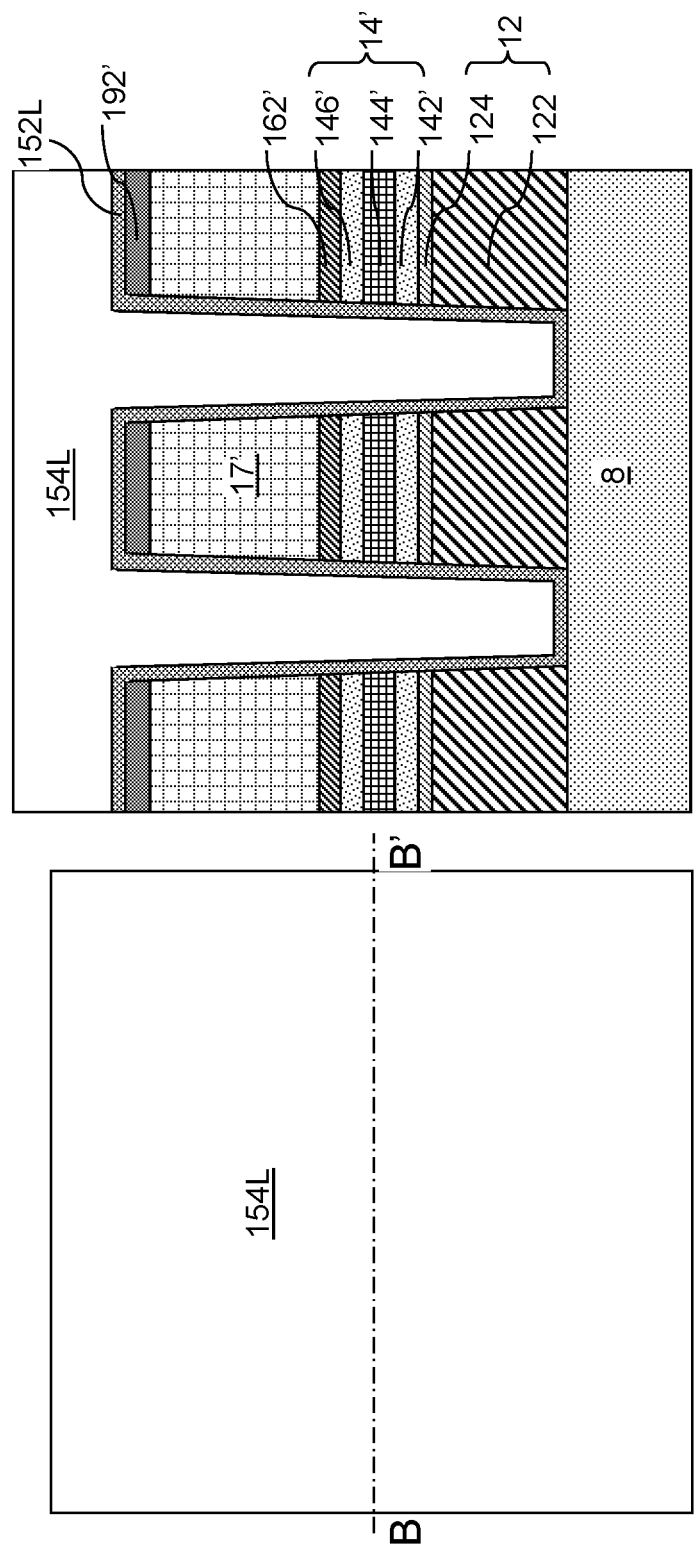
FIG. 3A is a vertical cross-sectional view of the exemplary structure after formation of a first continuous dielectric liner layer and a first dielectric fill material layer according to an embodiment of the present disclosure.
FIG. 3B is a vertical cross-sectional view of the exemplary structure along the vertical plane B-B' of FIG. 3A.

Referring to FIGS. 3A and 3B, a first continuous dielectric liner layer 152L can be optionally deposited on sidewalls and bottom surfaces of the first trenches 11 and over the first hard mask strips 192'. The first continuous dielectric liner layer 152L includes a dielectric material such as silicon nitride, a dielectric metal oxide (such as aluminum oxide), or silicon oxide. The first continuous dielectric liner layer 152L can be deposited by a conformal deposition method such as chemical vapor deposition (CVD) or atomic layer deposition (ALD). The thickness of the first continuous dielectric liner layer 152L can be in a range from 1 nm to 10 nm, such as from 2 nm to 6 nm, although lesser and greater thicknesses can also be employed. The first continuous dielectric liner layer 152L includes a material different from the material of the first sacrificial material rails 17'.

A first dielectric fill material layer 154L can be deposited on the first continuous dielectric liner layer 152L. The first dielectric fill material layer 154L includes a planarizable dielectric material such as undoped silicate glass, doped silicate glass, or a spin-on glass (SOG). The first dielectric fill material layer 154L can be deposited by a conformal deposition method or by a self-planarizing deposition method (such as spin coating). In one embodiment, the first continuous dielectric liner layer 152L can include, and/or can consist essentially of, a material selected from silicon nitride and a dielectric metal oxide, and the first dielectric fill material layer 154L can include, and/or can consist essentially of, a material selected from doped silicate glass and undoped silicate glass (e.g., silicon oxide).

Figure 4A:
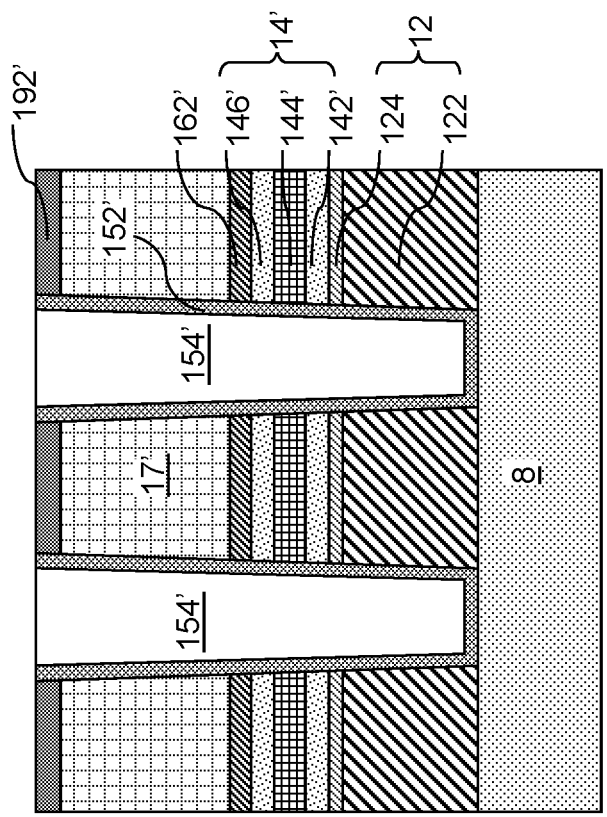
FIG. 4A is a vertical cross-sectional view of the exemplary structure after formation of first dielectric isolation structures in the first trenches by planarization of the first continuous dielectric liner layer and the first dielectric fill material layer according to an embodiment of the present disclosure.
Figure 4B:
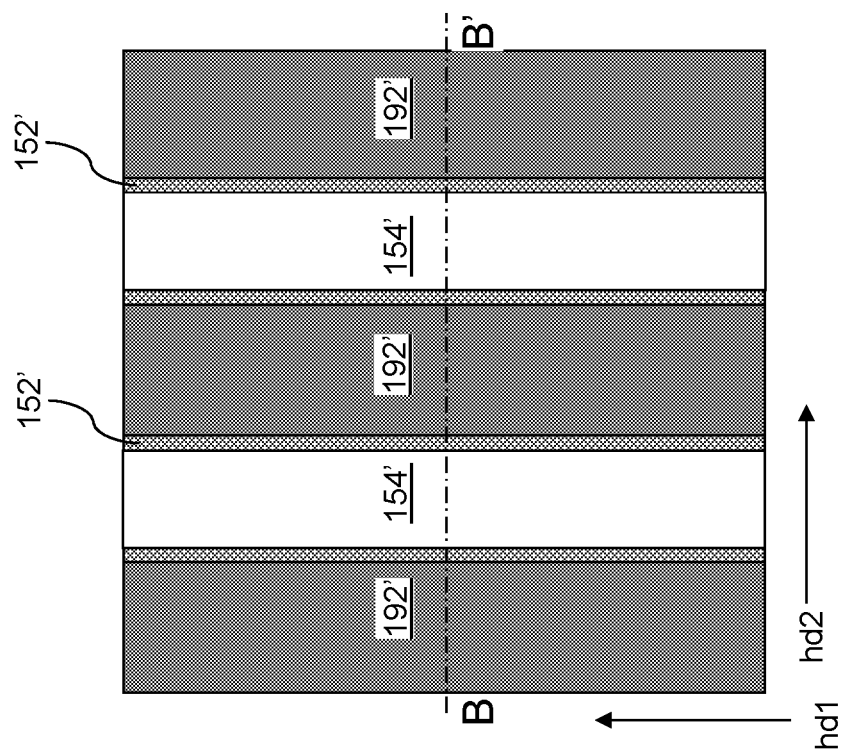
FIG. 4B is a vertical cross-sectional view of the exemplary structure along the vertical plane B-B' of FIG. 4A.

Referring to FIGS. 4A and 4B, portions of the first continuous dielectric liner layer 152L and the first dielectric fill material layer 154L can be removed from above the horizontal plane including top surfaces of the first hard mask strips 192' by a planarization process. The planarization process can include chemical mechanical planarization (CMP) and/or a recess etch process. Each remaining portion of the first continuous dielectric liner layer 152L constitutes a first dielectric liner portion 152', and each remaining portion of the first dielectric fill material layer 154L constitute a first dielectric fill material portion 154'. Each contiguous set of a first dielectric liner portion 152' and a first dielectric fill material portion 154' constitutes a first dielectric isolation structure (152', 154'), which is a dielectric isolation structure having a shape of a rail. A first dielectric isolation structure (152', 154') is formed in each of the first trenches 11 as a rail structure. The first dielectric isolation structures (152', 154') laterally extend along the first horizontal direction hd1, and are laterally spaced among one another along the second horizontal direction hd2. The top surfaces of the first dielectric isolation structures (152', 154') can be coplanar with the top surfaces of the first hard mask strips 192'.

Figure 5B:
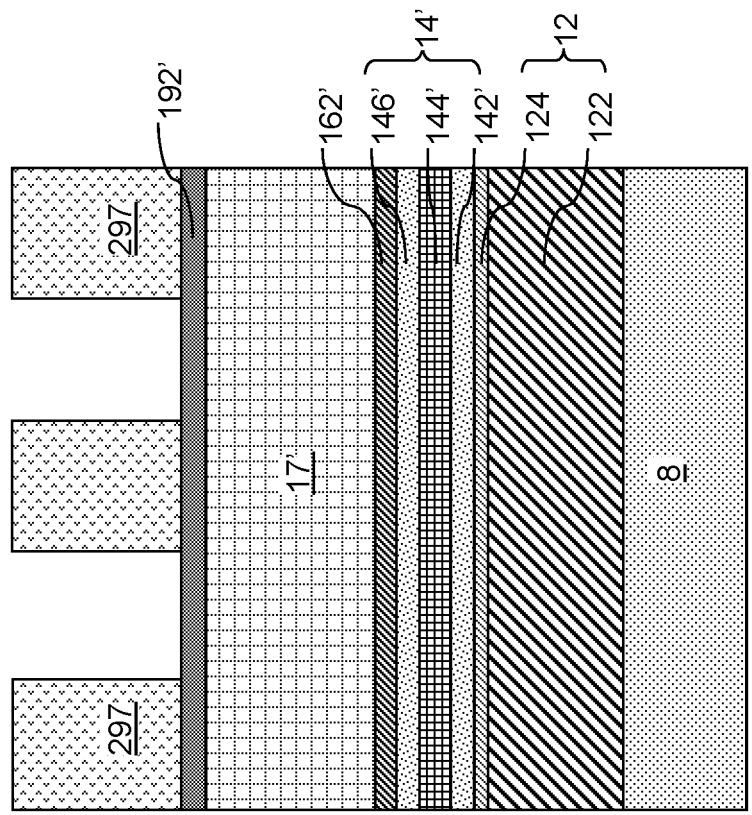
FIG. 5B is a vertical cross-sectional view of the exemplary structure along the vertical plane B-B' of FIG. 5A.
Figure 5A:
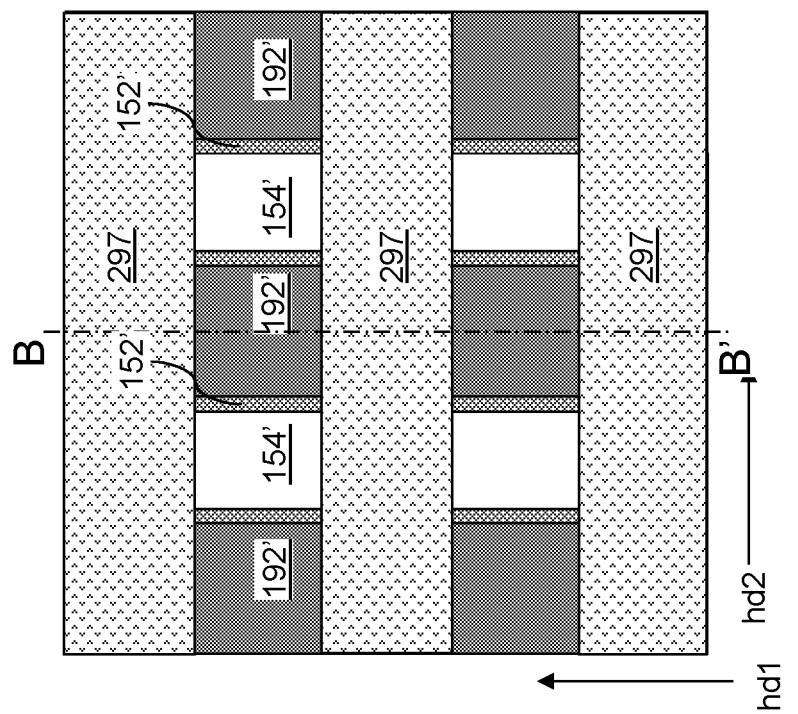
FIG. 5A is a top-down view of the exemplary structure after application and patterning of a second photoresist layer according to an embodiment of the present disclosure.
Figures 6A, 6B:
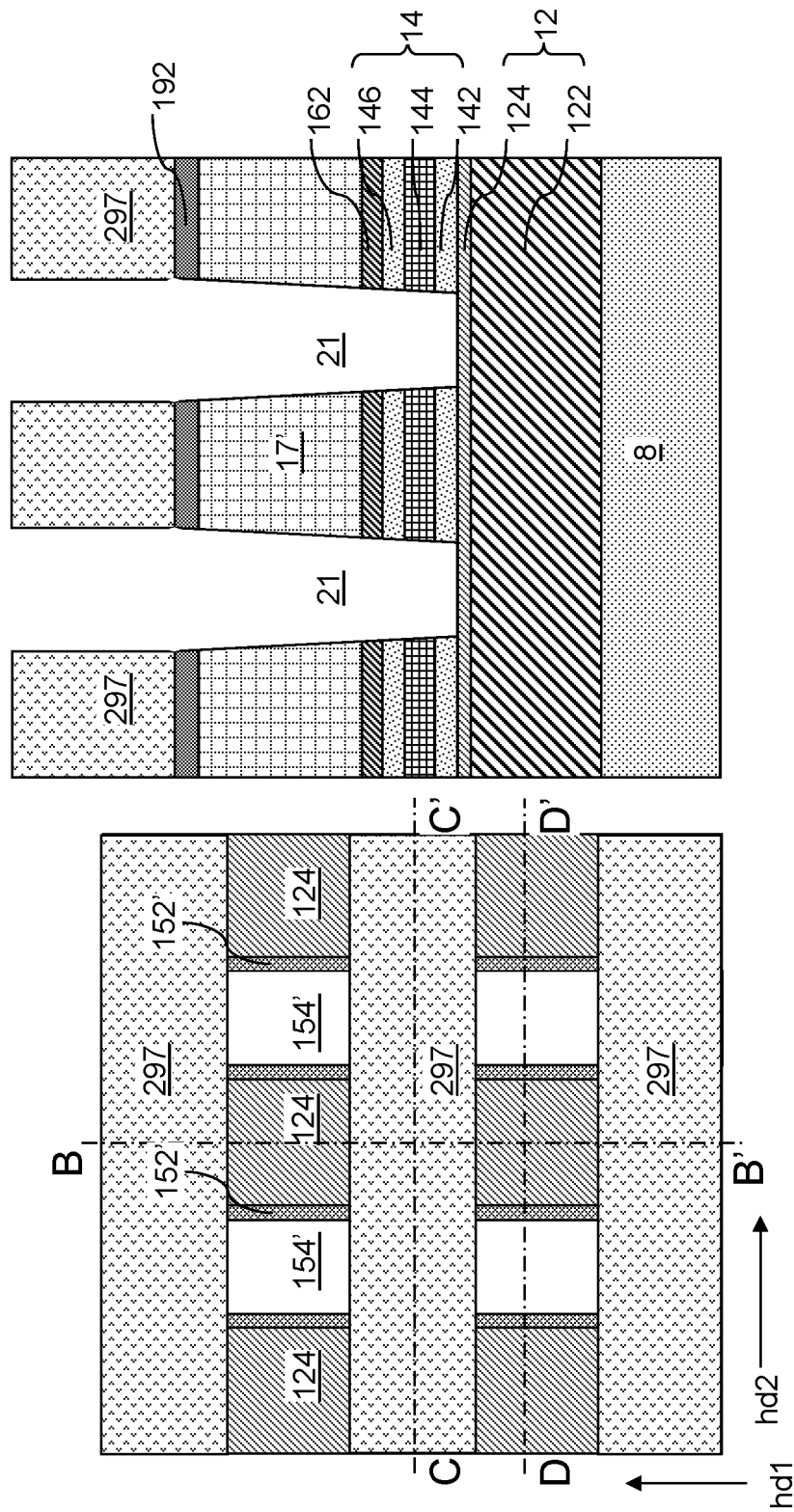
FIG. 6A is a vertical cross-sectional view of the exemplary structure after formation of second trenches through the first stacked rail structures and the first dielectric isolation structures according to an embodiment of the present disclosure.
FIG. 6B is a vertical cross-sectional view of the exemplary structure along the vertical plane B-B' of FIG. 6A.
Figure 7B:
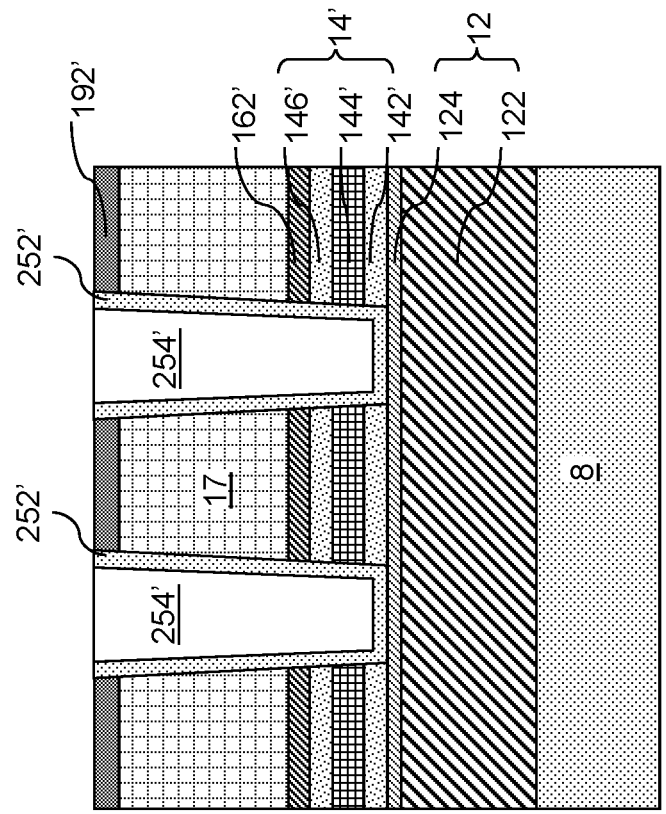
FIG. 7B is a vertical cross-sectional view of the exemplary structure along the vertical plane B-B' of FIG. 7A.
Figure 7A:
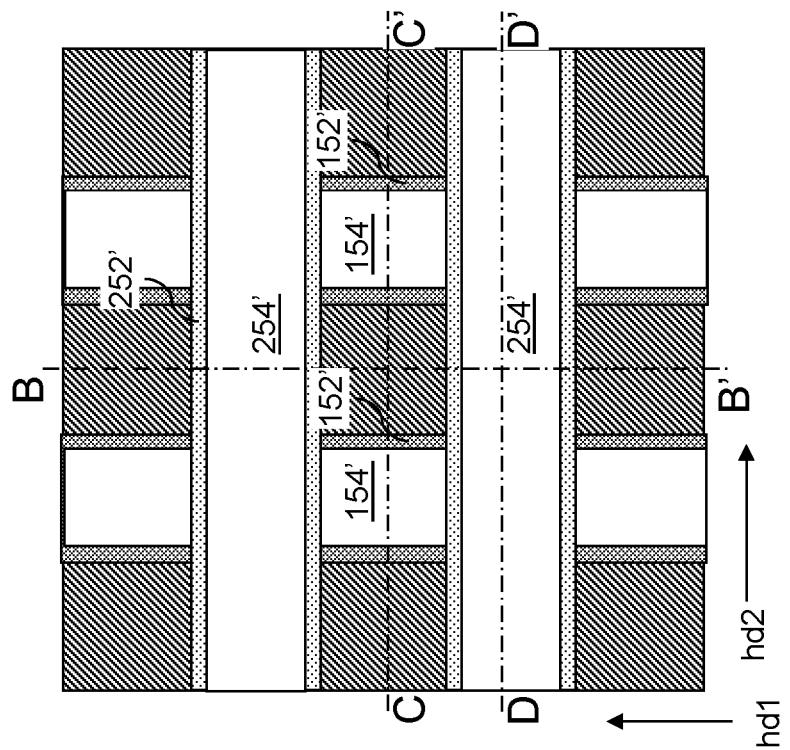
FIG. 7A is a vertical cross-sectional view of the exemplary structure after formation of second dielectric isolation structures in the second trenches according to an embodiment of the present disclosure.
Figures 9A, 9B:
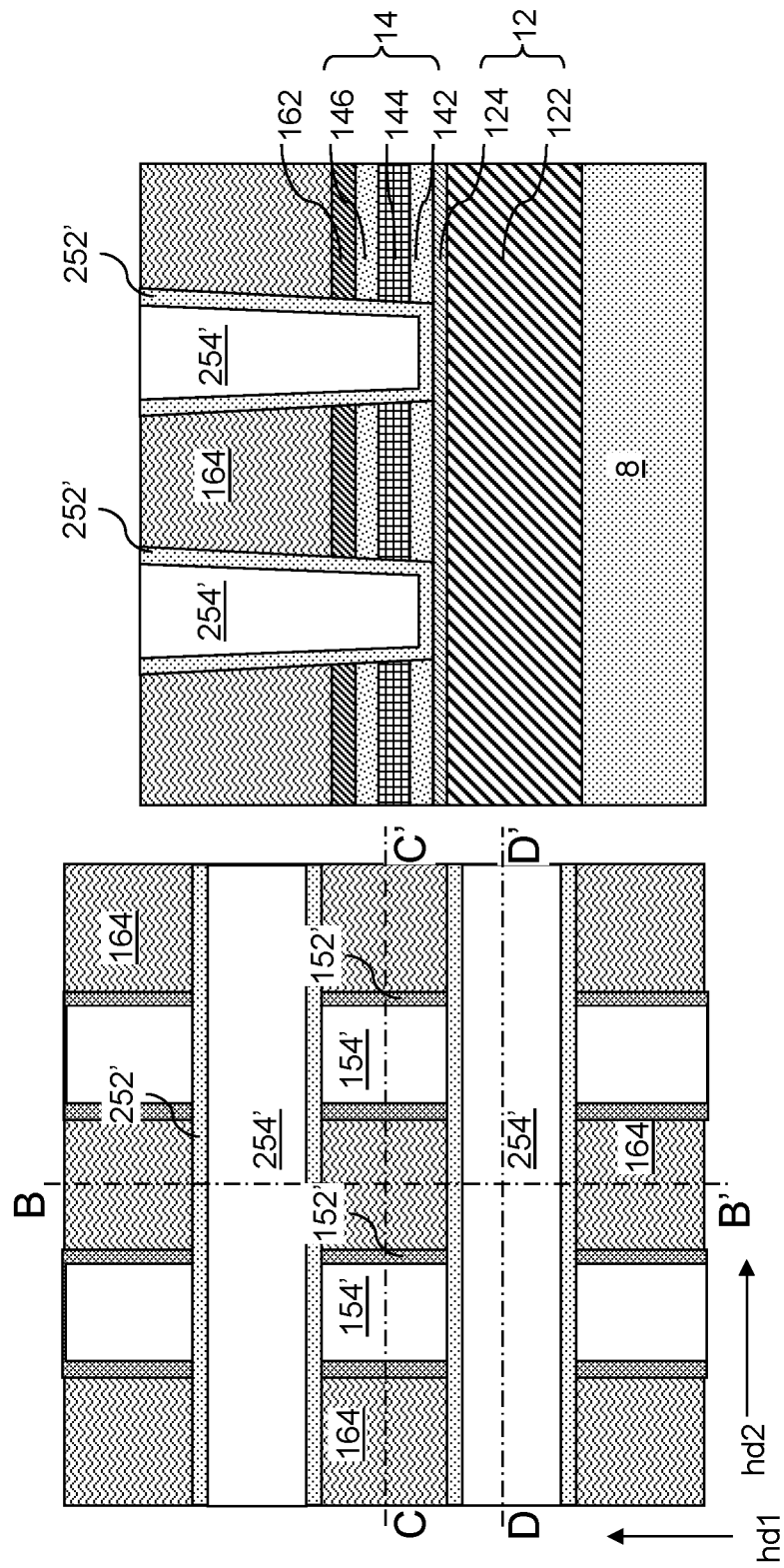
FIG. 9A is a vertical cross-sectional view of the exemplary structure after formation of first phase change memory material pillars according to an embodiment of the present disclosure.
FIG. 9B is a vertical cross-sectional view of the exemplary structure along the vertical plane B-B' of FIG. 9A.
Figure 15B:
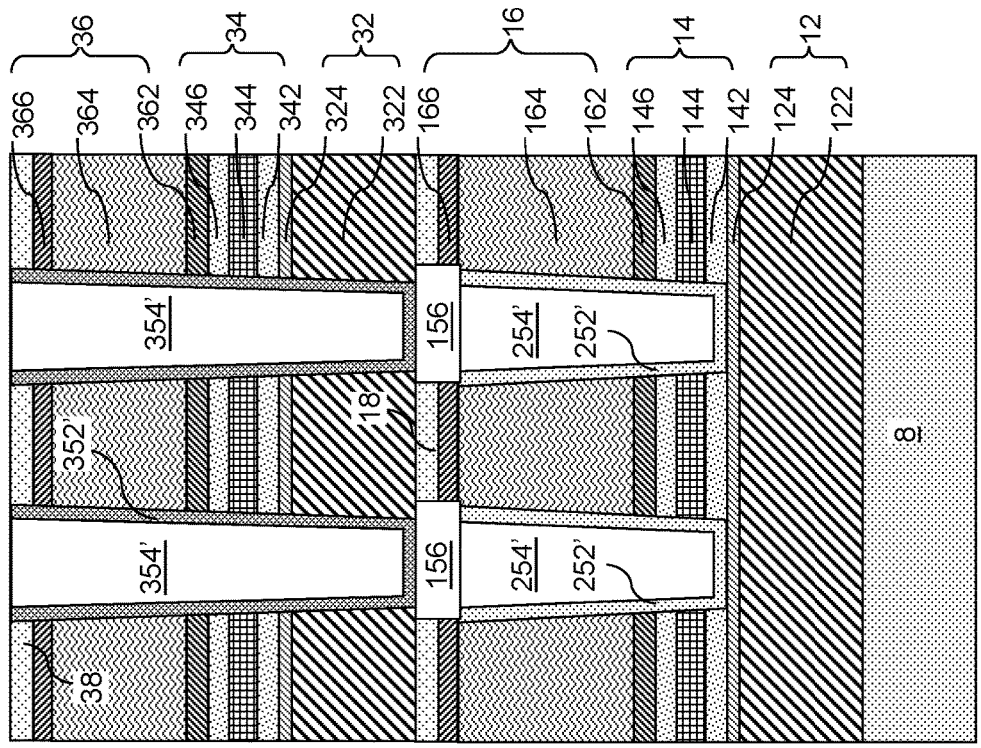
FIG. 15B is a vertical cross-sectional view of the exemplary structure along the vertical plane B-B' of FIG. 15A.
Figure 15A:
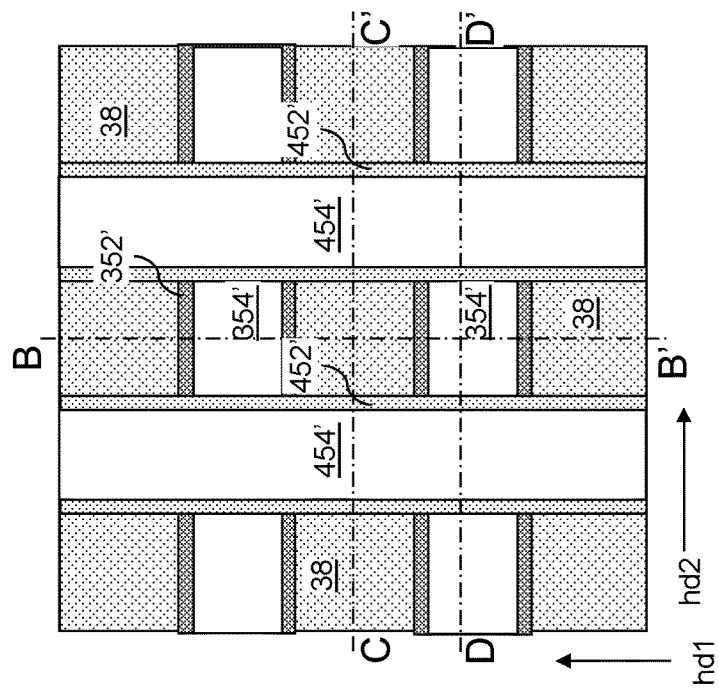
FIG. 15A is a vertical cross-sectional view of the alternative embodiment of the exemplary structure after forming a second-tier structure including an additional array of pillar structures according to an embodiment of the present disclosure.
Figures 15C, 15D:
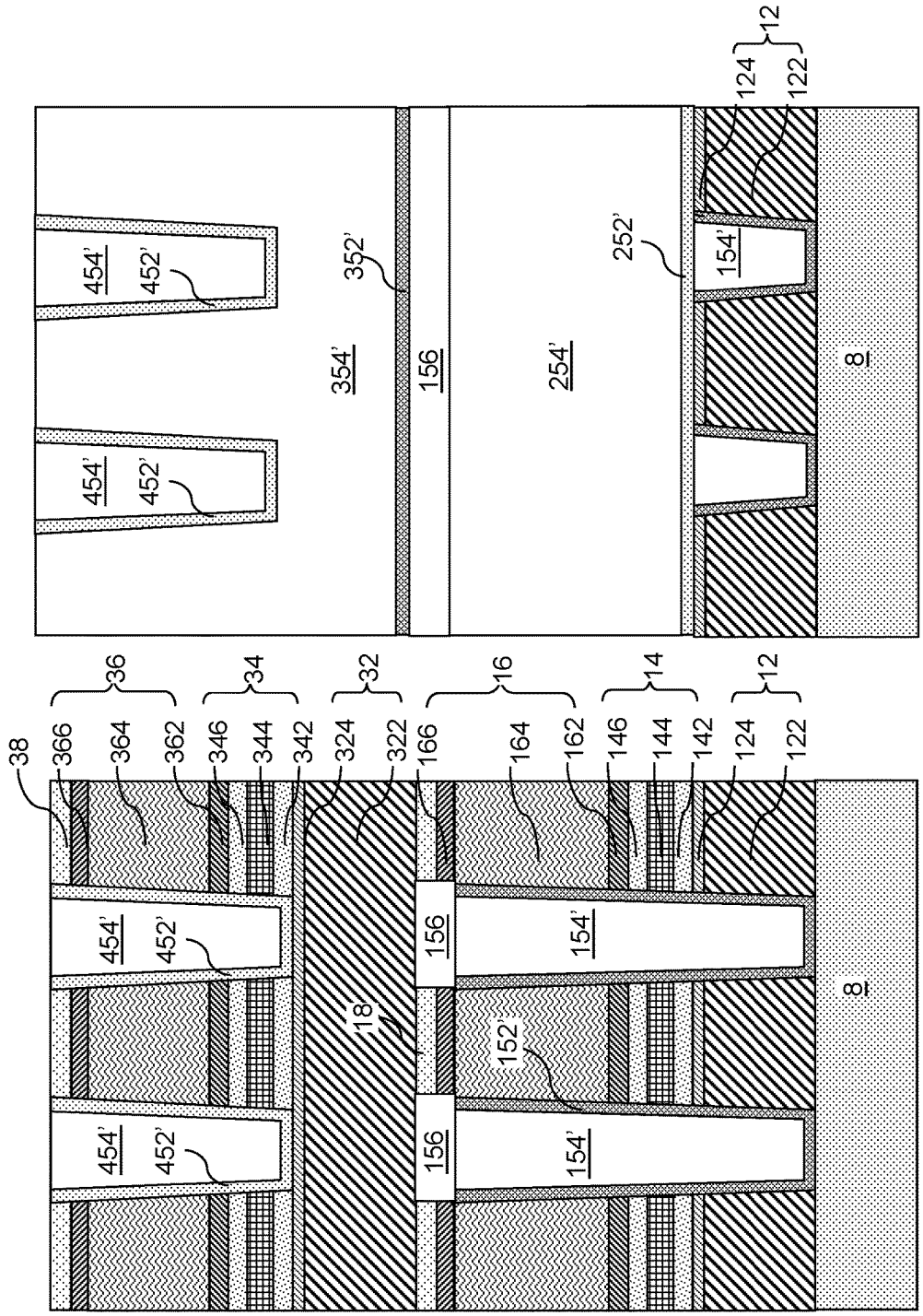
FIG. 15C is a vertical cross-sectional view of the exemplary structure along the vertical plane C-C' of FIG. 15A.
FIG. 15D is a vertical cross-sectional view of the exemplary structure along the vertical plane D-D' of FIG. 15A.

Referring to FIGS. 5A and 5B, an etch mask layer 297 having a line and space pattern can be formed over the first dielectric isolation structures (152', 154') and the first stacked rail structures (12, 14', 162', 17', 192'). In one embodiment, the etch mask layer 297 can be a lithographically patterned second photoresist layer. Patterned portions of the etch mask layer 297 laterally extend along the second horizontal direction hd2 with a respective uniform width. Thus, line trenches are present among the patterned portions of the etch mask layer 297. The line trenches laterally extend along the second horizontal direction hd2, and are laterally spaced apart along the first horizontal direction hd1. The line trenches can have a uniform width that is invariant with translation along the second horizontal direction hd2. The pattern in the etch mask layer 297 can be a periodic pattern that is repeated along the first horizontal direction hd1 with a pitch that is equal to the sum of the width of a line trench in the etch mask layer 297 and the width of a patterned portion of the etch mask layer 297. The pitch can be in a range from 32 nm to 600 nm, although lesser and greater pitches can also be employed.

Referring to FIGS. 6A-6D, an anisotropic etch process is performed to remove portions of the first hard mask strips 192', the first sacrificial material rails 17', the first selector rails 14', and upper regions of the first dielectric isolation structures (152', 154') that are not masked by the etch mask layer 297. The materials of the first hard mask strips 192', the first sacrificial material rails 17', the first selector rails 14', and the first dielectric isolation structures (152', 154') can be etched selective to the material in the top portions of the first conductive rails 12 by the anisotropic etch process. Volumes from which the materials of the first hard mask strips 192', the first sacrificial material rails 17', the first selector rails 14', and the first dielectric isolation structures (152', 154') are removed constitute the second trenches 21. Thus, the second trenches 21 laterally extend along the second horizontal direction hd2, and are formed by anisotropically etching through the first sacrificial material rails 17', the first selector rails 14', and the first dielectric isolation structures (152', 154').

The chemistry of the anisotropic etch process can be sequentially modified to etch through the various materials of the first hard mask strips 192', the first sacrificial material rails 17', the first selector rails 14', and the first dielectric isolation structures (152', 154'). The anisotropic etch process can stop at the top surface of, or within, the first conductive rails 12. The second trenches 21 can be line trenches having a uniform vertical cross-sectional shape within vertical planes that are perpendicular to the second horizontal direction hd2. The uniform vertical cross-sectional shape of each second trench 21 can be invariant with translation along the second horizontal direction hd2. Each second trench 21 can vertically extend from the horizontal plane including the bottom surface of the etch mask layer 297 to the horizontal plane including top surfaces of the first conductive rails 12.

Each vertical stack of first hard mask strips 192', the first sacrificial material rails 17', the first selector rails 14' is divided into a plurality of in-process first pillar structures (14, 162, 17, 192) that are laterally spaced apart long the first horizontal direction hd1. As used herein, a "pillar" or a "pillar structure" refers to a structure that extends along a vertical direction such that each sidewall of the structure is vertical or is substantially vertical. As used herein, a sidewall is "substantially vertical" if the sidewall is tapered, i.e., tilted, with respect to a vertical direction by a tilt angle that is less than 10 degrees. As used herein, an "in-process" structure refers to a structure that is formed during a processing step and is subsequently modified.

Each in-process first pillar structure (14, 162, 17, 192) includes, from bottom to top, a first selector pillar 14 that is a patterned portion of a first selector rail 14', an optional first lower conductive liner plate 162 that is a patterned portion of a first lower conductive liner strip 162', a first sacrificial material pillar 17 that is a patterned portion of a first sacrificial material rail 17', and an optional first hard mask plate 192 that is a patterned portion of a first hard mask strip 192'. As used herein, a "plate" refers to a structure with a uniform thickness that is less than the maximum lateral dimension of the structure in any horizontal direction. The in-process first pillar structures (14, 162, 17, 192) form a two-dimensional array. In one embodiment, the in-process first pillar structures (14, 162, 17, 192) can form a periodic two-dimensional array having a first uniform pitch along the first horizontal direction hd1 and having a second uniform pitch along the second horizontal direction hd2.

Each first selector pillar 14 is a selector element, i.e., an element that provides non-linear voltage-current characteristics such that the element functions as a conductor under first voltage bias conditions and as an insulator under second voltage bias conditions. In one embodiment, each first selector pillar 14 can include a vertical stack of a first lower barrier material portion 142 that is a patterned portion of a first lower barrier material strip 142', a first threshold switch material portion, such as a first ovonic threshold switch material portion 144 that is a patterned portion of a first ovonic threshold switch material rail 144', and a first upper barrier material portion 146 that is a patterned portion of a first upper barrier material strip 146'.

Each contiguous set of a remaining portion of the first hard mask strips 192', a remaining portion of the first sacrificial material rails 17', an optional remaining portion of the first lower conductive liner strips 162', and a remaining portion of the first selector rails 14' constitutes an in-process first pillar structure (14, 162, 17, 192). Each first selector element, i.e., each first selector pillar 14, includes a respective portion of the first selector rails 14' that is patterned by the anisotropic etch process, and each first sacrificial material pillar 17 includes a respective portion of the first sacrificial material rails 17' that is patterned by the anisotropic etch process. In one embodiment, each selector element 14 includes a first ovonic threshold switch material portion 144, an upper amorphous carbon portion that contacts a top surface of the first ovonic threshold switch material portion 144 as a first upper barrier material portion 146, and a lower amorphous carbon portion that contacts a bottom surface of the first ovonic threshold switch material portion 144 as a first lower barrier material portion 142. The etch mask layer 297 can be subsequently removed, for example, by ashing.

Each first dielectric isolation structure (152', 154') has a laterally undulating height after the anisotropic etch process. Specifically, the height of each first dielectric isolation structure (152', 154') can be the same as the total thickness of a first stacked rail structure (12, 14', 162', 17', 192') as provided at the processing steps of FIGS. 4A and 4B underneath each portion of the etch mask layer 297, as shown in FIG. 6C, and can be about the same as the height (i.e., the thickness) of a first conductive rail 12 underneath each second trench 21, as shown in FIG. 6D. Each first dielectric isolation structure (152', 154') can continuously extend underneath a plurality of second trenches 21, as shown in FIG. 6D.

Referring to FIGS. 7A-7D, second dielectric isolation structures (252', 254') can be formed in the second trenches 21. Specifically, a second continuous dielectric liner layer can be optionally deposited on sidewalls and bottom surfaces of the second trenches 21 and over the first hard mask plates 192. The second continuous dielectric liner layer includes a dielectric material such as silicon nitride, a dielectric metal oxide (such as aluminum oxide), or silicon oxide. The second continuous dielectric liner layer can be deposited by a conformal deposition method such as chemical vapor deposition (CVD) or atomic layer deposition (ALD). The thickness of the second continuous dielectric liner layer can be in a range from 1 nm to 10 nm, such as from 2 nm to 6 nm, although lesser and greater thicknesses can also be employed. The second continuous dielectric liner layer includes a material different from the material of the first sacrificial material pillars 17.

A second dielectric fill material layer can be deposited on the second continuous dielectric liner layer. The second dielectric fill material layer includes a planarizable dielectric material such as undoped silicate glass, doped silicate glass, or a spin-on glass (SOG). The second dielectric fill material layer can be deposited by a conformal deposition method or by a self-planarizing deposition method (such as spin coating). In one embodiment, the second continuous dielectric liner layer can include, and/or can consist essentially of, a material selected from silicon nitride and a dielectric metal oxide, and the second dielectric fill material layer can include, and/or can consist essentially of, a material selected from doped silicate glass and undoped silicate glass.

Portions of the second continuous dielectric liner layer and the second dielectric fill material layer can be removed from above the horizontal plane including top surfaces of the first hard mask plates 192 by a planarization process. The planarization process can include chemical mechanical planarization (CMP) and/or a recess etch process. Each remaining portion of the second continuous dielectric liner layer constitutes a second dielectric liner portion 252', and each remaining portion of the second dielectric fill material layer constitute a second dielectric fill material portion 254'. Each contiguous set of a second dielectric liner portion 252' and a second dielectric fill material portion 254' constitutes a second dielectric isolation structure (252', 254'), which is a dielectric isolation structures having a shape of a rail. A second dielectric isolation structure (252', 254') is formed in each of the second trenches 21 as a rail structure. The second dielectric isolation structures (252', 254') laterally extend along the second horizontal direction hd2, and are laterally spaced among one another along the first horizontal direction hd1.

The top surfaces of the second dielectric isolation structures (252', 254') can be coplanar with the top surfaces of the first hard mask plates 192. Bottom surfaces of the second dielectric isolation structures (252', 254') can contact top surfaces of the first conductive rails 12 and recessed top surfaces of the first dielectric isolation structures (152', 154'). Sidewalls of the second dielectric isolation structures (252', 254') can contact sidewalls of each material portion within the in-process first pillar structures (14, 162, 17, 192), sidewalls of first dielectric liner portions 152', and sidewalls of first dielectric fill material portions 154'.

Referring to FIGS. 8A-8D, the first hard mask plates 192 can be removed by an etch process. The removal of the first hard mask plates 192 may be performed selectively, or non-selectively, with respect to the material of the first sacrificial material pillars 17. For example, if the first hard mask plates 192 include silicon nitride, a wet etch employing hot phosphoric acid can be performed to remove the first hard mask plates 192.

Subsequently, the first sacrificial material pillars 17 can be removed without removing the first and second dielectric isolation structures (152', 154', 252', 254') and the first selector elements 14, i.e., the first selector pillars. First cavities 29 are formed in volumes from which the first hard mask plates 192 and the first sacrificial material pillars 17 are removed. The first cavities 29 can form a two-dimensional array. In one embodiment, the first cavities 29 can be a periodic two-dimensional array of cavities having a first pitch along the first horizontal direction hd1 and a second pitch along the second horizontal direction hd2.

In one embodiment, each in-process first pillar structures (14, 162, 17, 192) can include a respective first lower conductive liner plate 162. In such cases, removal of the first sacrificial material pillars can be effected by performing a selective removal process that removes the first sacrificial material pillars 17 selective to materials of the first lower conductive liner plates 162 (which are remaining portions of the first lower conductive liner strips 162'), the first dielectric isolation structures (152', 154'), and the second dielectric isolation structures (252', 254'). For example, if the first sacrificial material pillars 17 include polysilicon or amorphous silicon, the first sacrificial material pillars 17 can be removed by a wet etch employing a potassium hydroxide (KOH) solution. If the first sacrificial material pillars 17 include germanium, the first sacrificial material pillars 17 can be removed by a wet etch employing a mixture of ammonium hydroxide and hydrogen peroxide. If the first sacrificial material pillars 17 include amorphous carbon or diamond-like carbon (DLC), the first sacrificial material pillars 17 can be removed by ashing.

Referring to FIGS. 9A-9D, first phase change memory material pillars 164 are formed in the first trenches by a damascene method. A damascene method is a method for forming a material portion within at least one recessed volume defined by a surrounding structure in which the material is deposited in the at least one recessed volume and excess portions of the material is removed from above a horizontal plane including a top surface of the surrounding structure. Specifically, a first phase change memory material is deposited in the first cavities 29 employing a deposition method such as physical vapor deposition (PVD), chemical vapor deposition (CVD), atomic layer deposition (ALD), vacuum evaporation, or any other suitable deposition method. Excess portions of the first phase change memory material can be removed from outside the first cavities 29. For example, the excess portions of the first phase change memory material can be removed from above a horizontal plane including the top surfaces of the first dielectric isolation structures (152', 154') and the second dielectric isolation structures (252', 254') by a planarization process such as a chemical mechanical planarization (CMP) process. Optionally, a recess etch may be employed in combination with, or in lieu of, the CMP process.

As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound.

Each remaining portion of the first phase change memory material that fills a first cavity 29 constitutes a first phase change memory material pillar 164. Each in-process first pillar structures (14, 162, 17, 192) is replaced with a first pillar structure (14, 162, 164), which includes, from bottom to top, a first selector element 14, a first lower conductive liner plate 162, and a first phase change memory material pillar 164. The first pillar structures (14, 162, 164) can be arranged as a two-dimensional array. In one embodiment, the first pillar structures (14, 162, 164) can be arranged as a periodic two-dimensional array having a first pitch along the first horizontal direction hd1 and a second pitch along the second horizontal direction hd2. The first pitch can be the same as or different from the second pitch. The first phase change memory material pillars 164 are formed by a damascene process, and sidewalls of the first phase change memory material pillars 164 are not subjected to any etch chemistry. As such, sidewalls of the first phase change memory material pillars 164 do not include any chemical or structural damage that may be caused by plasma or chemicals employed in an etch process. Thus, a high quality phase change material without etch damage is provided in the first phase change memory material pillars 164.

Referring to FIGS. 10A-10D, in one embodiment, the first phase change memory material pillars 164 can be vertically recessed in upper regions of the first cavities 29. A recess etch process can be employed to vertically recess the material of the first phase change memory material pillars 164. The recess etch process may be an isotropic etch process (such as a wet etch process) or an anisotropic etch process (such as a reactive ion etch process or a chemical dry etch process). The recess etch process removes the material of the first phase change memory material pillars 164 selective to the materials of the first dielectric isolation structures (152', 154') and the second dielectric isolation structures (252', 254'). In one embodiment, the recess etch process can be an anisotropic etch process employing a halogen-based etchant gas, which may be chlorine-based, fluorine-based, or bromine-based. Fluoride based post etch treatment may be employed to clean physically exposed surfaces of remaining portions of the first phase change memory material pillars 164.

Recess volumes 39 are formed above the remaining portions of the first phase change memory material pillars 164. The recess volumes 39 are not filled with any solid material. The recess depth, as measured between the horizontal plane including the top surfaces of the first dielectric isolation structures (152', 154') and the second dielectric isolation structures (252', 254') and the horizontal plane including the recessed surfaces of the first phase change memory material pillars 164, may be in a range from 15 nm to 75 nm, such as from 25 nm to 60 nm, although lesser and greater recess depths can also be employed. Each first phase change memory material pillar 164 can have a height in a range from 15 nm to 175 nm, such as from 25 nm to 90 nm, after the recess process, although lesser and greater heights can also be employed.

Referring to FIGS. 11A-11D, a layer stack including a first upper conductive liner plate 166 and a first barrier material layer 18 can be formed in each recess volume 39 above the first phase change memory material pillars 164. The first upper conductive liner plates 166 can include a metal such as tungsten, titanium, or tantalum. The first upper conductive liner plates 166 can be formed by depositing a metal in the recess volumes, removing portions of the metal from outside the recess volumes by a first planarization process, and subsequently removing the metal from upper regions of the recess volumes by an etch-back process. The etch-back process may include a wet etch process or a dry etch process. Remaining portions of the metal in lower regions of the recess volumes constitute the first upper conductive liner plates 166. The thickness of the first upper conductive liner plates 166 may be in a range from 1 nm to 10 nm, such as from 1.5 nm to 5 nm, although lesser and greater thicknesses can also be employed. Each vertical stack of a first lower conductive liner plate 162, a first phase change memory material pillar 164, and a first upper conductive liner plate 166 constitutes a first phase change memory element 16, which is a pillar structure. The first phase change memory elements 16 can form a two-dimensional array, which may be a periodic two-dimensional array.

A barrier material can be subsequently deposited in the upper portions of the recess volumes. The barrier material is a material that can prevent diffusion of, and provide effective encapsulation of, the first phase change memory material. In one embodiment, the barrier material can include, and/or can consist essentially of, amorphous carbon. Portions of the barrier material from outside the recess volumes by a second planarization process. Remaining portions of the barrier material constitute the first barrier material portions 18. Each first barrier material portion 18 is a first barrier element that prevents diffusion of the first phase change memory material. Thus, a first barrier element 18 is formed on each of the first phase change memory material pillars 18. The top surfaces of the first barrier material portions 18 are within as same horizontal plane as the top surfaces of the first dielectric isolation structures (152', 154') and top surfaces of the second dielectric isolation structures (252', 254'). The thickness of each first barrier element 18 can be in a range from 12 nm to 75 nm, such as from 20 nm to 60 nm, although lesser and grater thicknesses can also be employed. The set of all structural elements formed above the substrate 8 up to the processing steps of FIGS. 11A-11D constitute a first-tier structure.

This completes a two dimensional phase change memory device. A method of manufacturing the two dimensional a phase change memory device includes forming a selector layer (14L or 144L) over a substrate 8 and forming a sacrificial material layer 17L over the selector layer (14L or 144L), as shown in FIGS. 1A and 1B. The method also includes patterning the selector layer (14L or 144L) and the sacrificial material layer 17L to form discrete selector element (14 or 144) and sacrificial material 17 stacks separated by openings, such as trenches (11 and/or 21). Dielectric isolation structures [(152, 154) and/or (252, 254) are formed in the openings (11 and/or 21). Cavities 29 are formed by removing the sacrificial material portions 17 without removing the dielectric isolation structures and the selector portions (14 or 144), as shown in FIGS. 8A-8D. Phase change memory material portions (16 or 164) are then formed in the cavities 29 by a damascene method that deposits a phase change memory material in the cavities 29, as shown in FIGS. 9A-9D.

Word lines 12 can be formed below the selector layer (14 or 144) and bit lines 32 can be formed above the phase change memory material portions 164. The bit lines 32 extend in a different (e.g., perpendicular) direction than the word lines 12. Forming the dielectric isolation structures can include forming a dielectric liner layer (152 and/or 252) in the openings (11 and/or 21) and forming a dielectric fill material layer (154 and/or 254) on the dielectric liner layer. In one embodiment, the selector element 14 comprises a chalcogenide ovonic threshold switch material 144, and the phase change memory material of portions 164 is selected from germanium antimony telluride compounds, germanium antimony compounds, indium germanium telluride compounds, aluminum selenium telluride compounds, indium selenium telluride compounds, and aluminum indium selenium telluride compounds.

In another embodiment shown in FIGS. 12A-12D, the two dimensional phase change memory device is extended to a three dimensional phase change memory device by forming a second-tier structure including an additional array of pillar structures over the first-tier structure. The second-tier structure can be formed over the first-tier structure by repeating the processing steps employed to form the first-tier structure with a 90 degree rotation in the patterns.

Specifically, a second vertical stack is formed over the first-tier structure. The second vertical stack can include a second conductive material layer, a second selector layer, an optional second lower conductive liner layer, a second sacrificial material layer, and a second hard mask layer. Each component layer within the second vertical stack can include any material that can be employed in a corresponding layer within the first vertical stack (12L, 14L, 162L, 17L, 192L). Further, each component layer within the second vertical stack can have the same thickness range as the corresponding layer within the first vertical stack (12L, 14L, 162L, 17L, 192L).

The second vertical stack can be patterned into second stacked rail structures, each of which laterally extends along the second horizontal direction hd2 and are laterally spaced apart by third trenches. For example, a photoresist layer can be applied and patterned over the second vertical stack to form a line and space pattern in which patterned portions of the photoresist layer laterally extend along the second horizontal direction hd2 with a respective uniform width. An anisotropic etch can be performed, which employs the patterned portions of the photoresist layer as an etch mask. The anisotropic etch transfers the pattern in the photoresist layer through the second vertical stack to form the second stacked rail structures.

The third trenches laterally extend along the second horizontal direction hd2. Each second stacked rail structure includes, from bottom to top, a second conductive rail 32 that is a patterned portion of the second conductive material layer, a second selector rail that is a patterned portion of the second selector layer, an optional second lower conductive liner strip that is a patterned portion of the second lower conductive liner layer, a second sacrificial material rail that is a patterned portion of the second sacrificial material layer, and an optional second hard mask strip that is a patterned portion of the second hard mask layer. In one embodiment, each of the second conductive rails 32 can include a vertical stack of a second metal rail 322 that is a patterned portion of a second metal layer and a second metal nitride strip 324 that is a patterned portion of a second metal nitride layer. Each second conductive rail 32 can be formed on top surfaces of the first barrier material portions 18 and on top surfaces of the first dielectric isolation structures (152', 154'). In one embodiment, each second selector rail can include a vertical stack of a second lower barrier material strip, a second ovonic threshold switch material rail, and a second upper barrier material strip.

Third dielectric isolation structure (352', 354') can be formed in the third trenches by performing the same type of processing steps as the processing steps employed to form the first dielectric isolation structures (152', 154'). Each third dielectric isolation structure (352', 354') can be formed directly on top surfaces of the second dielectric isolation structures (352', 354'). Each third dielectric isolation structure (352', 354') includes a third dielectric liner portion 352' and a third dielectric fill material portion 354', and laterally extends along the second horizontal direction hd2.

Subsequently, the second hard mask strips, the second sacrificial material rails, the second selector rails, and the third dielectric isolation structures (352', 354') can be patterned to form fourth trenches that laterally extend along the first horizontal direction hd1. An anisotropic etch process can be employed, which can stop at the top surface of, or within, the second conductive rails 32. Each vertical stack of second hard mask strips, the second sacrificial material rails, the second selector rails is divided into a plurality of in-process second pillar structures that are laterally spaced apart long the second horizontal direction hd2.

Each in-process second pillar structure includes, from bottom to top, a second selector pillar 34 that is a patterned portion of a second selector rail, an optional second lower conductive liner plate 362 that is a patterned portion of a second lower conductive liner strip, a second sacrificial material pillar that is a patterned portion of a second sacrificial material rail, and an optional first hard mask plate that is a patterned portion of a second hard mask strip. The in-process second pillar structures form a two-dimensional array. In one embodiment, the in-process second pillar structures can form a periodic two-dimensional array having a second uniform pitch along the second horizontal direction hd1 and having a second uniform pitch along the second horizontal direction hd2.

Each second selector pillar 34 is a selector element. In one embodiment, each second selector pillar 34 can include a vertical stack of a second lower barrier material portion 342 that is a patterned portion of a second lower barrier material strip, a second ovonic threshold switch material portion 344 that is a patterned portion of a second ovonic threshold switch material rail, and a second upper barrier material portion 346 that is a patterned portion of a second upper barrier material strip. Each third dielectric isolation structure (352', 354') has a laterally undulating height after the anisotropic etch process. Specifically, the height of each third dielectric isolation structure (352', 354') can be the same as the total thickness of a second stacked rail structure, and can be about the same as the height (i.e., the thickness) of a second conductive rail 32 underneath each fourth trench. Each third dielectric isolation structure (352', 354') can continuously extend underneath a plurality of fourth trenches.

Fourth dielectric isolation structures (452', 454') can be formed in the fourth trenches by performing the same type of processing steps as the processing steps employed to form the second dielectric isolation structures (252', 254'). Each fourth dielectric isolation structure (452', 454') can be formed directly on top surfaces of the second conductive rails 32. Each fourth dielectric isolation structure (452', 454') includes a fourth dielectric liner portion 452' and a fourth dielectric fill material portion 454', and laterally extends along the first horizontal direction hd1.

The second hard mask plates can be removed by an etch process. The removal of the second hard mask plates may be performed selectively, or non-selectively, with respect to the material of the second sacrificial material pillars. Subsequently, the second sacrificial material pillars can be removed without removing the third and fourth dielectric isolation structures (352', 354', 452', 454') and the second selector elements 34, i.e., the second selector pillars. Second cavities are formed in volumes from which the second hard mask plates and the second sacrificial material pillars are removed. The second cavities can form a two-dimensional array.

In one embodiment, each in-process second pillar structures can include a respective second lower conductive liner plate 362. In such cases, removal of the second sacrificial material pillars can be effected by performing a selective removal process that removes the second sacrificial material pillars selective to materials of the second lower conductive liner plates 362, the third dielectric isolation structures (352', 354'), and the fourth dielectric isolation structures (452', 454').

Second phase change memory material pillars 364 are formed in the second trenches by a damascene method. A second phase change memory material is deposited in the second cavities employing a deposition method such as physical vapor deposition (PVD), chemical vapor deposition (CVD), atomic layer deposition (ALD), vacuum evaporation, or any other suitable deposition method. Excess portions of the second phase change memory material can be removed from outside the second cavities. For example, the excess portions of the second phase change memory material can be removed from above a horizontal plane including the top surfaces of the third dielectric isolation structures (352', 354') and the fourth dielectric isolation structures (452', 454') by a planarization process such as a chemical mechanical planarization (CMP) process. Optionally, a recess etch may be employed in combination with, or in lieu of, the CMP process. The second phase change memory material can be the same as, or different from, the first phase change memory material. The second phase change memory material can be any material that may be employed for the first phase change memory material.

Each remaining portion of the second phase change memory material that fills a second cavity constitutes a second phase change memory material pillar 364. Each in-process second pillar structures is replaced with a second pillar structure (34, 362, 364), which includes, from bottom to top, a second selector element 34, a second lower conductive liner plate 362, and a second phase change memory material pillar 364. The second pillar structures (34, 362, 364) can be arranged as a two-dimensional array. In one embodiment, the second pillar structures (34, 362, 364) can be arranged as a periodic two-dimensional array the same periodicity as the first pillar structures (14, 162, 164) along the first horizontal direction hd1 and along the second horizontal direction hd2.

The second phase change memory material pillars 364 are formed by a damascene process, and sidewalls of the second phase change memory material pillars 364 are not subjected to any etch chemistry. As such, sidewalls of the second phase change memory material pillars 364 do not include any chemical or structural damage that may be caused by plasma or chemicals employed in an etch process. Thus, a high quality phase change material without etch damages is provided in the second phase change memory material pillars 364.

The second phase change memory material pillars 164 can be vertically recessed in upper regions of the second cavities. A recess etch process can be employed to vertically recess the material of the second phase change memory material pillars 364. Recess volumes are formed above the remaining portions of the second phase change memory material pillars 364. A layer stack including a second upper conductive liner plate 366 and a second barrier material layer 38 can be formed in each recess volume above the second phase change memory material pillars 364. The second upper conductive liner plates 366 can include any of the material that can be employed for the first upper conductive liner plates 166. Each vertical stack of a second lower conductive liner plate 362, a second phase change memory material pillar 364, and a second upper conductive liner plate 366 constitutes a second phase change memory element 36, which is a pillar structure. The second phase change memory elements 36 can form a two-dimensional array, which may be a periodic two-dimensional array. The second barrier material layers 38 can include the same material as the first barrier material layers 18.

Additional tier structures such as a third-tier structure and/or a fourth-tier structure can be formed over the second-tier structure to provide additional arrays of phase change memory elements in a series connection with a respective array of selector elements. Each phase change memory element can be in a series connection with a selector element between a respective pair of an overlying conductive rail and an underlying conductive rail.

Referring to FIGS. 13A and 13B, an alternative embodiment of the exemplary structure can be derived from the exemplary structure of FIGS. 9A-9D by forming a layer stack of a continuous upper conductive liner layer 166L and a continuous barrier material layer 18L over the first and second dielectric isolation structures (152', 154', 252', 254') and the first phase change memory material pillars 164. Thus, the first phase change memory material pillars 164 are not recessed after planarization and the recess volumes 39 are omitted in this embodiment. The continuous upper conductive liner layer 166L can include any material that can be employed for the first upper conductive liner plates 166. The thickness range for the continuous upper conductive liner layer 166L can be the same as the thickness range for the first upper conductive liner plates 166. The continuous barrier material layer 18L can include any material that can be employed for the first barrier material portions 18, and can have the same thickness range as the first barrier material portions 18. Each of the continuous upper conductive liner layer 166L and the continuous barrier material layer 18L can be deposited as a blanket layer, i.e., an unpatterned material layer.

Referring to FIGS. 14A and 14B, the layer stack of the continuous upper conductive liner layer 166L and the continuous barrier material layer 18L can be patterned into a two-dimensional array of stacks of a first upper conductive liner plate 166 and a first barrier material portion 18 that overlie a respective one of the first phase change memory material pillars 164. For example, a photoresist layer (not shown) can be applied over the layer stack of the continuous upper conductive liner layer 166L and the continuous barrier material layer 18L, and can be lithographically patterned to form a crisscross pattern that covers all areas of the first and second dielectric isolation structures (152', 154', 252', 254'). Physically exposed portions of the layer stack of the continuous upper conductive liner layer 166L and the continuous barrier material layer 18L can be etched to physically expose top surfaces of the first and second dielectric isolation structures (152', 154', 252', 254'). Each patterned portion of the continuous upper conductive liner layer 166L constitutes a first upper conductive liner plate 166. Each patterned portion of the continuous barrier material layer 18L constitutes a first barrier material portion 18. A two-dimensional array of stacks of a first upper conductive liner plate 166 and a first barrier material portion 18 is formed. The photoresist layer can be subsequently removed, for example, by ashing.

An insulating matrix layer 156 can be formed by filling gaps among the two-dimensional array of the stacks with a dielectric material and planarizing the dielectric material employing the stacks of a first upper conductive liner plate 166 and a first barrier material portions 18 as stopping structures. The insulating matrix layer 156 has a top surface that is coplanar with top surfaces of the first barrier material portions 18.

Referring to FIGS. 15A-15D, the processing steps of FIGS. 12A-12D can be performed to form a second-tier structure. In this case, the second conductive rails 32 are formed on top surfaces of the first barrier material portions 18 and on a top surface of the insulating matrix layer 156. The top surfaces of the first barrier material portions 18 are vertically offset from the horizontal plane including the top surfaces of the first dielectric isolation structures (152'. 154') and top surfaces of the second dielectric isolation structures (252'. 254') by a thickness of the insulating matrix layer 156.

The various embodiments of the present disclosure provide a phase change memory device employing a three-dimensional array of pillar structures in which electrical current flows vertically. Each pillar structure includes a selector element to enable selection of a phase change memory element through selection of a pair of a word line and a bit line, and thus, can provide a compact three-dimensional phase change memory structure. The sidewalls and the bottom surfaces of the phase change memory material pillars of the present disclosure are protected from etch damage or plasma damage, and thus, the phase change memory material pillars can include a high quality phase change material that has less defects at the sidewalls. Reduction in the defect density of the phase change memory material can be advantageously employed to provide a more reliable phase change memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a phase change memory device, comprising:
   forming first stacked rail structures laterally extending along a first horizontal direction and laterally spaced apart by first trenches along a second horizontal direction over a substrate, wherein each of the first stacked rail structures comprises a first conductive rail, a first selector rail, and a first sacrificial material rail;
   forming first dielectric isolation structures in the first trenches;
   forming second trenches laterally extending along the second horizontal through the first sacrificial material rails, the first selector rails, and the first dielectric isolation structures;

forming second dielectric isolation structures in the second trenches, wherein remaining portions of the first sacrificial material rails and first selector rails constitute in-process pillar structures including a respective vertical stack of a first selector element and a first sacrificial material pillar;

forming first cavities by removing the first sacrificial material pillars without removing the first and second dielectric isolation structures and the first selector elements;

forming first phase change memory material pillars in the first cavities by a damascene method that deposits a first phase change memory material in the first cavities and removes portions of the first phase change memory material from outside the first cavities;

vertically recessing the first phase change memory material pillars in upper regions of the first cavities to form recess volumes that are not filled with any solid material;

forming a stack of an upper conductive liner plate and a barrier material portion in each of the recess volumes by depositing a metal in the recess volumes, removing portions of the metal from outside the recess volumes by a first planarization process, and removing the metal from upper regions of the recess volumes, wherein remaining portions of the metal in lower regions of the recess volumes constitute the upper conductive liner plates; and depositing a barrier material in the upper portions of the recess volumes, and removing portions of the barrier material from outside the recess volumes by a second planarization process, wherein remaining volumes of the barrier material constitute the barrier material portions; and forming second conductive rails laterally extending along the second horizontal direction over the first phase change memory material pillars.

2. The method of claim 1, wherein:
the first selector element comprises a chalcogenide ovonic threshold switch material; and
the first phase change memory material is selected from germanium antimony telluride compounds, germanium antimony compounds, indium germanium telluride compounds, aluminum selenium telluride compounds, indium selenium telluride compounds, and aluminum indium selenium telluride compounds.

3. A method of manufacturing a phase change memory device, comprising:
forming first stacked rail structures laterally extending along a first horizontal direction and laterally spaced apart by first trenches along a second horizontal direction over a substrate, wherein each of the first stacked rail structures comprises a first conductive rail, a first selector rail, and a first sacrificial material rail;
forming first dielectric isolation structures in the first trenches;
forming second trenches laterally extending along the second horizontal through the first sacrificial material rails, the first selector rails, and the first dielectric isolation structures;
forming second dielectric isolation structures in the second trenches, wherein remaining portions of the first sacrificial material rails and first selector rails constitute in-process pillar structures including a respective vertical stack of a first selector element and a first sacrificial material pillar;
forming first cavities by removing the first sacrificial material pillars without removing the first and second dielectric isolation structures and the first selector elements;
forming first phase change memory material pillars in the first cavities by a damascene method that deposits a first phase change memory material in the first cavities and removes portions of the first phase change memory material from outside the first cavities;
depositing a layer stack including an upper conductive liner layer and a barrier material layer over the first and second dielectric isolation structures and the first phase change memory material pillars;
patterning the layer stack into a two-dimensional array of stacks of an upper conductive liner plate and a barrier material portion that overlie a respective one of the first phase change memory material pillars;
forming an insulating matrix layer by filling gaps among the two-dimensional array of the stacks with a dielectric material and planarizing the dielectric material to provide a top surface that is coplanar with top surfaces of the barrier material portions; and
forming second conductive rails laterally extending along the second horizontal direction over the first phase change memory material pillars, wherein the second conductive rails are formed on a respective row of the stacks within the two-dimensional array of the stacks that laterally extends along the second horizontal direction.

4. The method of claim 3, wherein:
the second conductive rails are formed on top surfaces of the barrier material portions and on a top surface of the insulating matrix layer; and
the top surfaces of the barrier material portions are vertically offset from a horizontal plane including the top surfaces of the first dielectric isolation structures and top surfaces of the second dielectric isolation structures by a thickness of the insulating matrix layer.

5. The method of claim 3, wherein:
the first selector element comprises a chalcogenide ovonic threshold switch material; and
the first phase change memory material is selected from germanium antimony telluride compounds, germanium antimony compounds, indium germanium telluride compounds, aluminum selenium telluride compounds, indium selenium telluride compounds, and aluminum indium selenium telluride compounds.

* * * * *